(12) United States Patent
Livsey et al.

(10) Patent No.: US 8,656,657 B2
(45) Date of Patent: Feb. 25, 2014

(54) PHOTOVOLTAIC ROOFING ELEMENTS

(75) Inventors: Robert D. Livsey, Limerick, PA (US); Robert L. Jenkins, Honeybrook, PA (US); Gregory F. Jacobs, Oreland, PA (US)

(73) Assignee: CertainTeed Corporation, Valley Forge, PA (US)

( * ) Notice: Subject to any disclaimer, the term of this patent is extended or adjusted under 35 U.S.C. 154(b) by 523 days.

(21) Appl. No.: 12/872,759

(22) Filed: Aug. 31, 2010

(65) Prior Publication Data

US 2011/0048507 A1 Mar. 3, 2011

Related U.S. Application Data

(60) Provisional application No. 61/238,566, filed on Aug. 31, 2009.

(51) Int. Cl.
*E04D 13/18* (2006.01)

(52) U.S. Cl.
USPC .......................................... 52/173.3

(58) Field of Classification Search
USPC ........... 52/173.3; 136/244, 251; 439/519, 521
See application file for complete search history.

(56) References Cited

U.S. PATENT DOCUMENTS

| 742,491 | A | 10/1903 | Quirk | |
|---|---|---|---|---|
| 4,321,416 | A | 3/1982 | Tennant | |
| 5,409,549 | A * | 4/1995 | Mori | 136/244 |
| 5,437,735 | A | 8/1995 | Younan et al. | |
| 5,575,861 | A | 11/1996 | Younan et al. | |
| 5,990,414 | A * | 11/1999 | Posnansky | 136/244 |
| 6,201,180 | B1 * | 3/2001 | Meyer et al. | 136/244 |
| 6,360,497 | B1 | 3/2002 | Nakazima et al. | |
| 6,453,629 | B1 | 9/2002 | Nakazima et al. | |
| 6,506,970 | B2 * | 1/2003 | Yamawaki | 136/251 |
| 6,521,821 | B2 | 2/2003 | Makita et al. | |
| 6,856,496 | B1 | 2/2005 | Mucci et al. | |
| 7,445,488 | B2 | 11/2008 | Feldmeier et al. | |
| 7,445,508 | B2 | 11/2008 | Daily et al. | |
| 8,168,880 | B2 * | 5/2012 | Jacobs et al. | 136/244 |
| 2001/0050102 | A1 * | 12/2001 | Matsumi et al. | 136/244 |
| 2002/0038530 | A1 | 4/2002 | Clark | |
| 2002/0129849 | A1 | 9/2002 | Heckeroth | |
| 2002/0134422 | A1 | 9/2002 | Bauman et al. | |
| 2003/0154666 | A1 | 8/2003 | Dinwoodie | |
| 2005/0076948 | A1 | 4/2005 | Komamine | |
| 2005/0112937 | A1 * | 5/2005 | Taga | 439/521 |
| 2005/0178429 | A1 * | 8/2005 | McCaskill et al. | 136/251 |

(Continued)

FOREIGN PATENT DOCUMENTS

| GB | 2448920 A1 | 11/2008 |
|---|---|---|
| WO | 2008057493 A2 | 5/2008 |
| WO | 2008073905 A2 | 6/2008 |
| WO | 2008085507 A2 | 7/2008 |

*Primary Examiner* — Christine T Cajilig
(74) *Attorney, Agent, or Firm* — McDonnell Boehnen Hulbert & Berghoff LLP

(57) ABSTRACT

The present invention relates generally to the photovoltaic generation of electrical energy. The present invention relates more particularly to photovoltaic roofing products for use in photovoltaically generating electrical energy. One aspect of the invention is a photovoltaic roofing element including a roofing substrate; a photovoltaic element disposed on the roofing substrate; an electrical connector operatively connected to the photovoltaic element, the electrical connector having a top side, a down-roof side and an electrical terminus; and a shield disposed adjacent the electrical terminus of the electrical connector on its down-roof side, its top side, or both.

24 Claims, 16 Drawing Sheets

(56) References Cited

U.S. PATENT DOCUMENTS

| | | |
|---|---|---|
| 2005/0279400 A1 | 12/2005 | Bannister |
| 2007/0074755 A1 | 4/2007 | Eberspacher et al. |
| 2008/0105291 A1* | 5/2008 | Pisklak et al. ............ 136/244 |
| 2008/0135090 A1* | 6/2008 | Corrales ............ 136/251 |
| 2008/0149170 A1* | 6/2008 | Hanoka ............ 136/251 |
| 2008/0160804 A1 | 7/2008 | Daily et al. |
| 2009/0215304 A1* | 8/2009 | Faust et al. ............ 439/358 |
| 2010/0146878 A1 | 6/2010 | Koch et al. |

* cited by examiner

PHOTOVOLTAIC ROOFING ELEMENTS

CROSS-REFERENCE TO RELATED APPLICATIONS

This application claims priority under 35 U.S.C. §119(e) to U.S. Provisional Patent Application Ser. No. 61/238,566, filed Aug. 31, 2009, which is hereby incorporated herein by reference in its entirety.

BACKGROUND OF THE INVENTION

1. Field of the Invention

The present invention relates generally to the photovoltaic generation of electrical energy. The present invention relates more particularly to photovoltaic roofing products for use in photovoltaically generating electrical energy.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as system performance has improved. They can be used, for example, to provide at least a significant fraction of the electrical energy needed for a building's overall function; or they can be used to power one or more particular devices, such as exterior lighting systems and well pumps.

Accordingly, research and development attention has turned toward integrating photovoltaic cells with roofing products such as shingles, shakes or tiles. A plurality of photovoltaic roofing elements (i.e., including photovoltaic media integrated with a roofing product) can be installed together on a roof, and electrically interconnected to form a photovoltaic roofing system that provides both environmental protection and photovoltaic power generation.

Roofing products equipped with photovoltaic media often require electrical connectors to be attached to the products to allow electricity to be collected from photovoltaic cells and delivered to an electrical system. Such connectors can be, for example, mated connectors for connecting adjacent photovoltaic roofing elements, cables for connecting photovoltaic elements to the mated connectors, and/or junction boxes for interconnections within a single photovoltaic roofing element. The interface between such connectors can be susceptible to ingress of moisture. Even when the mated connectors are covered by overlying roofing elements, wind-driven moisture can work its way up the roof underneath the overlying roofing elements and into the connection.

Moreover, such devices must be robust to maintain the electrical connection in use and over time. In some cases, bulky connectors with safety locks may be required depending on the accessibility of the electrical connection. If the electrical connector will be covered by the roofing product in use, requirements can be less extreme, but a robust connection remains necessary. There exist low-profile connectors, but even these can be difficult to integrate with thin roofing products like asphalt or bituminous roofing shingles. For the case where the roofing product is thin or of low thickness, a low profile or flatter style of connector may be used. When such a low profile connector is used, useful connectors are often still quite bulky with respect to a thin roofing product such as, for example, an asphalt or bituminous roofing shingle equipped with photovoltaic media. Bulky connectors underlying the roofing product may telegraph their structure to the top surface of the shingle resulting in a wavy or distorted appearance that is undesirable. The local telegraphing of bumps over connectors can also lead to stress points and wear points on or in the roofing material and have deleterious effect on product performance. Other electrical elements, such as cables and junction boxes can also cause undesirable aesthetic appearance and stress/wear points. Moreover, electrical connectors can often be susceptible to ingress of water blown up the roof by wind, even when they are disposed beneath a shingle or other roofing element.

There remains a need for photovoltaic roofing products that address one or more of these deficiencies.

SUMMARY OF THE INVENTION

One aspect of the invention is a photovoltaic roofing element including
- a roofing substrate;
- a photovoltaic element disposed on the roofing substrate;
- an electrical connector operatively connected to the photovoltaic element, the electrical connector having a top side, a down-roof side and an electrical terminus; and
- a shield disposed adjacent the electrical terminus of the electrical connector on its down-roof side, its top side, or both.

Another aspect of the invention is is a photovoltaic roofing system including an electrically-interconnected plurality of photovoltaic roofing elements, each including
- a roofing substrate;
- a photovoltaic element disposed on the roofing substrate;
- an electrical connector operatively connected to the photovoltaic element, the electrical connector having a top side, a down-roof side and an electrical terminus; and
- a shield disposed adjacent the electrical terminus of the electrical connector on its down-roof side, its top side, or both.

Another aspect of the invention is is a method for installing a photovoltaic roofing system, the method including disposing on a roof deck and electrically interconnecting a plurality of photovoltaic roofing elements, each including
- a roofing substrate;
- a photovoltaic element disposed on the roofing substrate;
- an electrical connector operatively connected to the photovoltaic element, the electrical connector having a top side, a down-roof side and an electrical terminus; and
- a shield disposed adjacent the electrical terminus of the electrical connector on its down-roof side, its top side, or both.

The invention will be further described with reference to embodiments depicted the appended figures. It will be appreciated that elements in the figures are illustrated for simplicity and clarity and have not necessarily been drawn to scale. For example, the dimensions of some of the elements in the figures may be exaggerated relative to other elements to help to improve understanding of embodiments of the invention.

BRIEF DESCRIPTION OF THE DRAWINGS

The accompanying drawings are not necessarily to scale, and sizes of various elements can be distorted for clarity.

DETAILED DESCRIPTION OF THE INVENTION

One aspect of the invention is a photovoltaic roofing element comprising a roofing substrate; a photovoltaic element disposed on the roofing substrate; an electrical connector operatively connected to the photovoltaic element, the electrical connector having a top side, a down-roof side and an electrical terminus; and a shield disposed adjacent the electrical terminus of the electrical connector on its down-roof side, its top side, or both. For example, in certain embodiments, the shield is disposed adjacent the electrical terminus of the electrical connector at least on its down-roof side. In other embodiments, the shield is disposed adjacent the electrical terminus of the electrical connector at least on its top side. As described in more detail below, the shield can be provided as part of the electrical connector, part of the roofing element, or as a separate piece assembled therewith.

Figure 1:
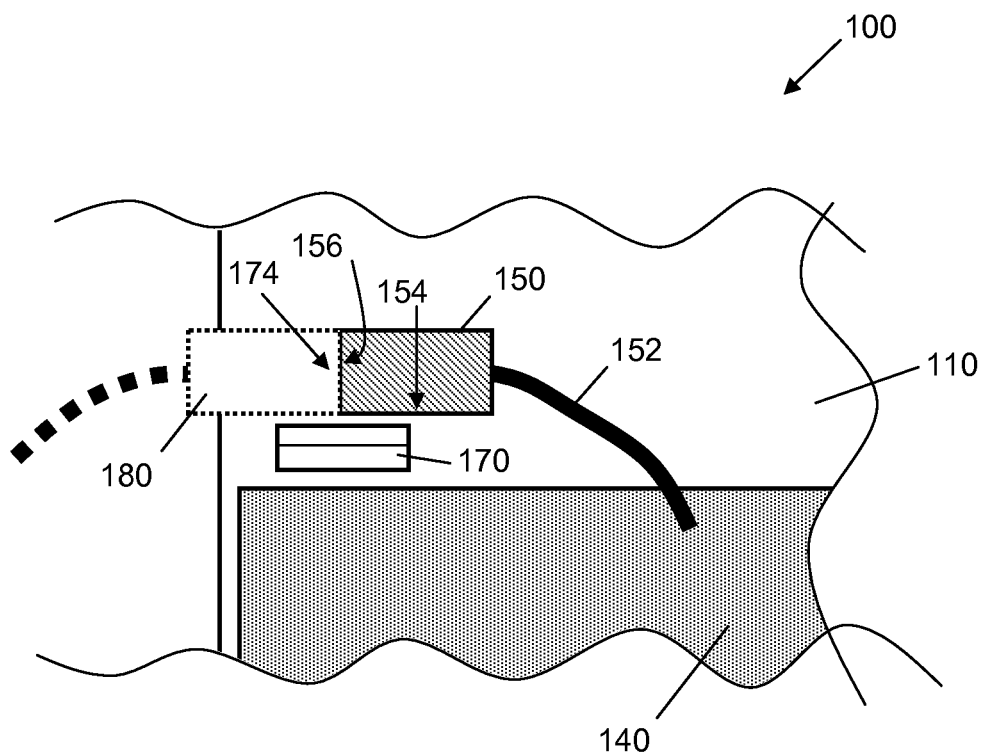
FIG. 1 is a partial top schematic view.
Figure 2:
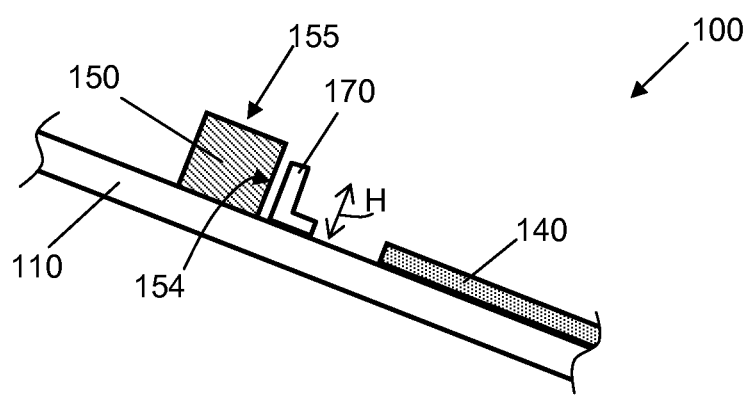
FIG. 2 is a partial schematic cross-sectional view of a photovoltaic roofing element according to one embodiment of the invention.

One embodiment of the invention is shown in partial top schematic view in FIG. 1, and in partial schematic cross-sectional view in FIG. 2. A photovoltaic roofing element 100 comprises a roofing substrate 110; a photovoltaic element 140 disposed on the roofing substrate; an electrical connector 150 operatively connected to the photovoltaic element (e.g., through cable 152), the electrical connector having a down-roof side 154, a top side 155 and an electrical terminus 156. The photovoltaic roofing element also includes a shield 170 disposed adjacent the electrical terminus, so that it spans the interface 174 between the electrical connector 150 and a mating electrical connector 180 (shown in dotted outline) from an adjacent photovoltaic roofing element. Such a shield can help protect the electrical connection from wind-blown rain.

In certain embodiments, the shield is in substantial contact with the roofing substrate, as shown in FIG. 2. In such embodiments, the shield can block wind-blown moisture from running up the surface of the photovoltaic roofing element and into electrical terminus of the electrical connector (e.g., at the point of interconnection between interconnected connectors). In certain embodiments, the shield is attached to the roofing substrate (e.g., by nailing the horizontal portion of the shield through the roofing substrate and into the roof deck, or otherwise attaching the shield to the roofing substrate). In other embodiments, the shield is merely disposed on the roofing substrate. The shield, can, for example, be held against the roofing substrate by pressure from overlying photovoltaic roofing elements. The shield can, for example, be sealed to roofing substrate with a sealant, for example, an adhesive or a layer of polymer against which the shield is disposed, so as to prevent water from penentrating beneath the shield. In other embodiments, the shield is formed as part of the roofing substrate (e.g., in a compression molded substrate as described in U.S. Patent Application Publication no. 2009/0000222, which is hereby incorporated herein by reference in its entirety).

In the embodiments of FIGS. 1 and 2, the shield is an element disposed on the roofing substrate and extending away from the substrate, positioned in front of (i.e., down-roof from) the electrical terminus of the electrical connector (i.e., from where the interface between connectors would be when the electrical connector is interconnected with another electrical connector, e.g., from another photovoltaic roofing element or from a wiring system.

In other embodiments, the shield can be, for example, integrally formed with the electrical connector, or otherwise physically connected to the connector. For example, the connector 350 shown in schematic top view in FIG. 3 has a shield 370 on its down roof-side 354 extending from its end bearing electrical terminus 356. When connected with a mating connector 380 (shown in dotted outline), the shield is disposed in front of the interface 374 between the two, helping to protect it from moisture migrating up the roof (e.g., due to wind).

Figure 4:
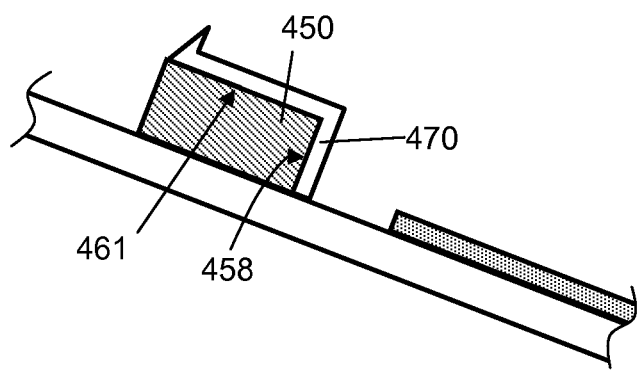
FIGS. 4 and 5 are a partial schematic cross-sectional views os photovoltaic roofing elements according to other embodiments of the invention.

Another embodiment is shown in partial schematic cross-sectional view in FIG. 4. In this embodiment, the electrical connector 450 is protected by shield 470 (e.g., disposed adjacent or attached thereto as described above). Shield 470 covers the electrical connector on its down-roof side 458 and its top side 461, protecting the interface between the electrical connector 450 and an adjacent electrical connector (not shown), e.g., from wiring system or adjacent photovoltaic roofing element, that mates therewith. As described above, the shield can be, for example, attached to the electrical connector (e.g., through a snap fit or adhered using adhesive), or integrally formed therewith (e.g., from a single molded plastic article). In other embodiments, the shield can be attached to the roof, and simply rests over the connector. Moreover, while the shield 470 is shown as being in contact with the top surface 461 of the electrical connector 450 in FIG. 4, in other embodiments there can be space in between.

In certain embodiments, for example as shown in FIGS. 1 and 2, the terminus of the electrical connector is oriented laterally, as opposed to up- or down the roof and the shield is disposed adjacent the electrical terminus on its down-roof side. The shield can also protect other sides of the interface between the electrical connectors, for example, the top side (i.e., relative to the plane of the roof), for example, as shown in FIG. 4.

In certain embodiments, the shield is disposed adjacent the electrical connector on its top side. Another embodiment is shown in side cross-sectional schematic view in FIG. 5. In this embodiment, the electrical connector 550 has its electrical terminus 556 on the up-roof side of the electrical connector. Shield 570 covers the electrical connector on its top side 561, protecting the interface 574 between the electrical connector 550 and the electrical connector 580 (shown in dotted outline), e.g., from a wiring system or adjacent photovoltaic roofing element, that mates therewith. As described above, the shield can be, for example, attached to the electrical connector e.g., through a snap fit, or integrally formed therewith (e.g., from a single molded plastic article).

Figure 5:
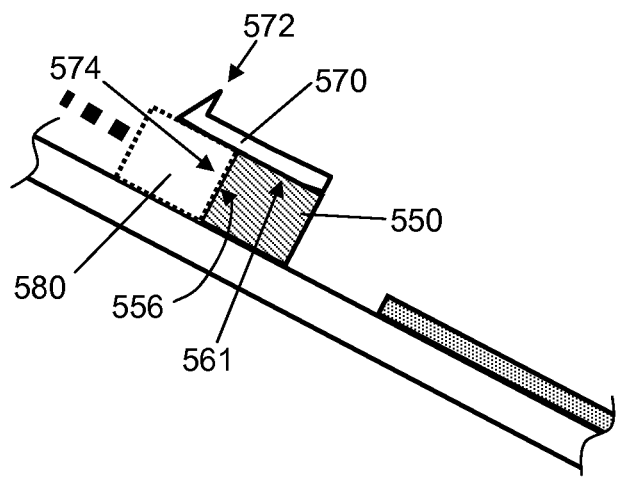

In certain embodiments, for example as shown in FIG. 5, the terminus of the electrical connector is oriented up the roof and the shield is disposed adjacent the electrical terminus on its top side. The shield can also protect other sides of the interface between the electrical connectors, for example, the down-roof side.

Figure 6:
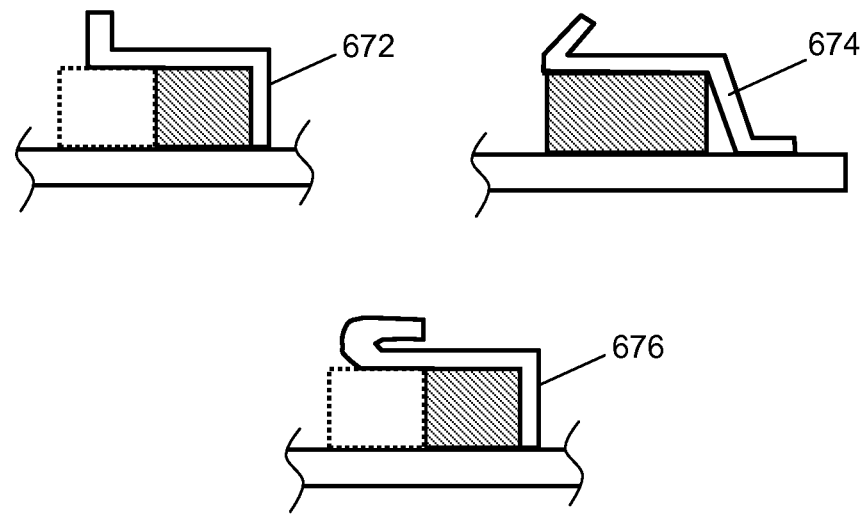
FIG. 6 is a set of schematic cross-sectional views of flange configurations according to certain embodiments of the invention.

In certain embodiments, the shield can have a vertical or down-roof pointing flange, for example as shown by reference number 572 in FIG. 5. Such a flange can help to keep water from working its way over the top of the shield and down into the electrical interface. A variety of possible configurations for the flange are shown in schematic cross-sectional view in FIG. 6. The flange can, for example, point in a vertical direction (i.e., substantially perpendicular to the plane of the roofing element on which it is disposed), as shown in shield 672, or can point in the down-roof direction (i.e., angle away from the perpendicular in the down-roof direction), as shown in shields 674 and 676. The flange can be, for example, a folded-over section of the material used to make the shield.

Figure 3:
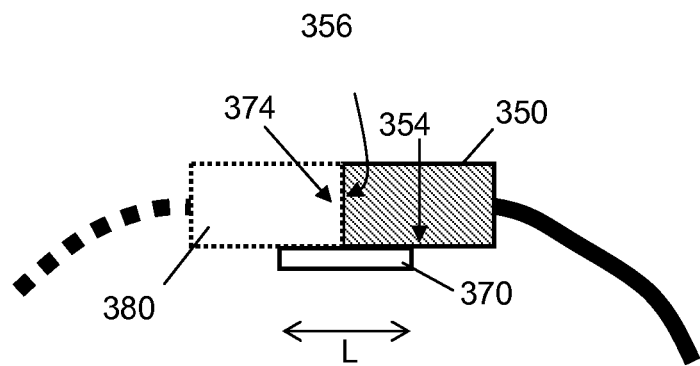
FIG. 3 is a top schematic view of an electrical connector and a shield according to another embodiment of the invention.

In certain embodiments, the shield has a lateral dimension (e.g., in a direction parallel to the roof and perpendicular to the slope of the roof, as shown by arrow "L" in FIG. 3) of at least about 1 cm (e.g., in the range of about 1 cm to about 5 cm). In certain embodiments, the shield has a vertical dimension (e.g., in a direction perpendicular to the plane of the roof) of at least about 0.5 cm, or even about 1 cm (e.g., in the range of about 1 cm to about 3 cm), as shown by arrow "H" in FIG. 2. In certain embodiments, the vertical dimension of the shield is at least about 50% of the height of the electrical connector. Of course, as the person of skill will recognize, the vertical dimension of the shield need only be sufficient to provide the desired moisture-blocking properties.

Shields suitable for use in the present invention can be formed from a variety of materials, for example, plastic or metal. A variety of techniques can be used by the person of skill in the art to fabricate and install shields, as would be apparent to the person of skill in the art. Moreover, the shields can be installed onto the roofing element at any convenient time, for example, before it is installed on the roof, after it is installed on the roof, or even after installation and connection of the photovoltaic elements.

Photovoltaic elements suitable for use in the various aspects of the present invention include one or more interconnected photovoltaic cells provided together, for example, in a single package. The photovoltaic cells of the photovoltaic elements can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide and copper indium gallium selenide. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell. The photovoltaic elements for use in the present invention can be flexible, or alternatively can be rigid.

The photovoltaic elements can be encapsulated photovoltaic elements, in which photovoltaic cells are encapsulated between various layers of material (e.g., as a laminate). For example, a photovoltaic laminate can include a top laminate layer at its top surface, and a bottom laminate layer at its bottom surface. The top laminate layer material can, for example, provide environmental protection to the underlying photovoltaic cells, and any other underlying layers. Examples of suitable materials for the top layer material include fluoropolymers, for example ETFE ("TEFZEL", or NORTON ETFE), PFE, FEP, PVF ("TEDLAR"), PCTFE or PVDF. The top laminate layer material can alternatively be, for example, a glass sheet, or a non-fluorinated polymeric material (e.g., polypropylene or acrylic). The bottom laminate layer material can be, for example, a fluoropolymer, for example ETFE ("TEFZEL", or NORTON ETFE), PFE, FEP, PVDF or PVF ("TEDLAR"). The bottom laminate layer material can alternatively be, for example, a polymeric material (e.g., polyolefin such as polypropylene, polyester such as PET); or a metallic material (e.g., steel or aluminum sheet).

Figure 7:
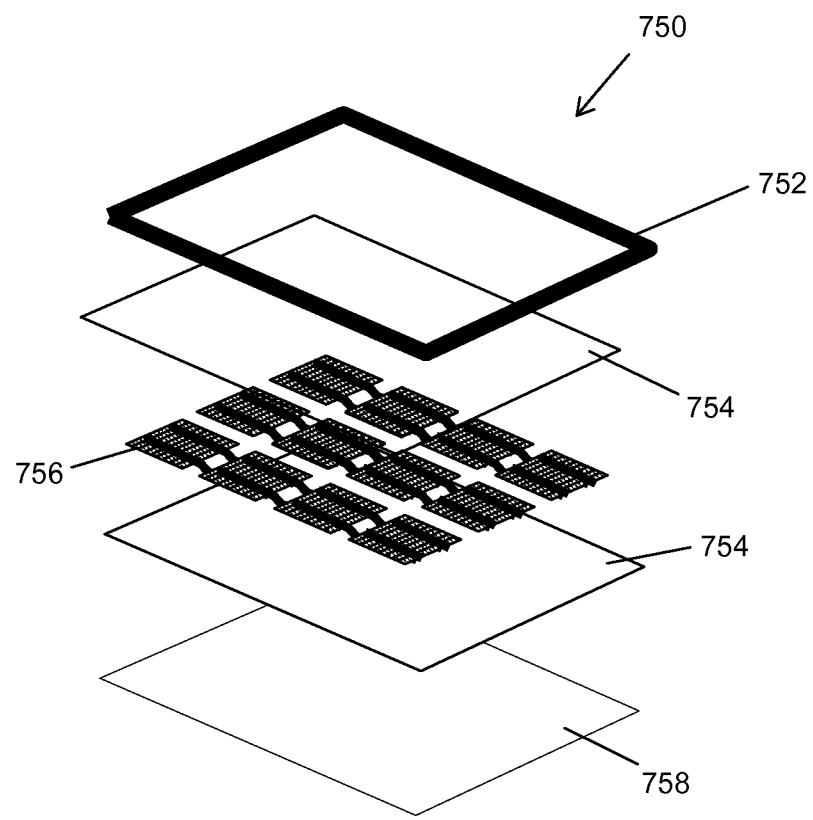
FIG. 7 is a schematic exploded view of an encapsulated photovoltaic element suitable for use in practicing various embodiments of the invention.

As the person of skill in the art will appreciate, a photovoltaic laminate can include other layers interspersed between the top laminate layer and the bottom laminate layer. For example, a photovoltaic laminate can include structural elements (e.g., a reinforcing layer of glass, metal, glass or polymer fibers, a rigid film, or a flexible film); adhesive layers (e.g., EVA to adhere other layers together); mounting structures (e.g., clips, holes, or tabs); one or more electrical components (e.g., electrodes, electrical connectors; optionally connectorized electrical wires or cables) for electrically interconnecting the photovoltaic cell(s) of the encapsulated photovoltaic element with an electrical system. As described in more detail below, the return electrical path, any series interconnections between photovoltaic elements, and any bypass diodes can be included within the laminate. An example of a photovoltaic laminate suitable for use in the present invention is shown in schematic exploded view FIG. 7. Encapsulated photovoltaic element 750 includes a top protective layer 752 (e.g., glass or a fluoropolymer film such as ETFE, PVDF, PVF, FEP, PFA or PCTFE); encapsulant layers 754 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 756 (which can include the return electrical path and bypass diode as described above); and a backing layer 758 (e.g., PVDF, PVF, PET).

The photovoltaic element can include at least one antireflection coating, for example as the top layer material in an encapsulated photovoltaic element, or disposed between the top layer material and the photovoltaic cells. The photovoltaic element can also be made colored, textured, or patterned, for example by using colored, textured or patterned layers in the construction of the photovoltaic element. Methods for adjusting the appearance of photovoltaic elements are described, for example, in U.S. Provisional Patent Application Ser. No. 61/019,740, and U.S. patent application Ser. Nos. 11/456, 200, 11/742,909, 12/145,166, 12/266,481 and 12/267,458 each of which is hereby incorporated herein by reference.

Suitable photovoltaic elements can be obtained, for example, from China Electric Equipment Group of Nanjing, China, as well as from several domestic suppliers such as Uni-Solar Ovonic, Sharp, Shell Solar, BP Solar, USFC, First-Solar, Ascent Solar, General Electric, Schott Solar, Evergreen Solar and Global Solar. Moreover, the person of skill in the art can fabricate photovoltaic laminates using techniques such as lamination or autoclave processes. Photovoltaic laminates can be made, for example, using methods disclosed in U.S. Pat. No. 5,273,608, which is hereby incorporated herein by reference. Flexible photovoltaic elements are commercially available from Uni-Solar as L-cells having a dimension of approximately 9.5"×14", S-cells having dimensions of approximately 4.75"×14", and T-cells having dimensions of approximately 4.75"×7". Photovoltaic laminates of custom sizes can also be made.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

The person of skill in the art will select bypass diode characteristics depending on a number of factors. The characteristics of the diode will depend, for example, on the type and size of photovoltaic element used, the intensity and variability of sunlight expected at the installation location, and the resistance at which a shaded photovoltaic element causes unacceptable system inefficiency. For example, the bypass diode can be configured to bypass a photovoltaic element when its output drops below about 30% of its maximum (i.e., in full sunlight at noon on the solstice) output (i.e., a about 30% or greater degradation in photovoltaically-generated current), below about 50% of its maximum output, below about 70% of its maximum output, below about 90% of its maximum output, or even below about 95% of its maximum output. For example, in one embodiment, in a 20 cell series-connected array of 1 volt/5 amp producing photovoltaic elements, the bypass diodes can be selected to bypass the photovoltaic elements when the output current drops below 4.75 amps (i.e., below 95% of the maximum output). Of course, as the person of skill will appreciate, each system design will have its own set of parameters; with higher amperage systems, relatively more degradation of current can be tolerated. In certain embodiments, the bypass diode can be an 8 amp bypass diode, available from Northern Arizona Wind & Sun, Flagstaff, Ariz.

In other embodiments, the bypass diode can be configured to bypass a photovoltaic element when its resistivity increases by at least about 400% of its resistivity at maximum output, at least about 300% of its resistivity at maximum output, at least about 100% of its resistivity at maximum output, at least about 50% of its resistivity at maximum output, at least about 25% of its resistivity at its maximum output, or even at least about 5% of its resistivity at maximum output.

The present invention can be practiced using any of a number of types of roofing substrates. In certain embodiments, the roofing substrate is a flexible roofing substrate. For example, the roofing substrate can be an asphalt shingle, a bituminous shingle or a plastic shingle. For example, the roofing substrate can be a multilayer asphalt shingle. The manufacture of photovoltaic roofing elements using a variety of roofing substrates are described, for example, in U.S. patent application Ser. Nos. 12/146,986, 12/266,409, 12/268, 313, 12/351,653, and 12/339,943, and U.S. Patent Application Publication no. 2007/0266562, each of which is hereby incorporated herein by reference in its entirety.

A variety of electrical connectors can be used in practicing the various embodiments of the invention. An electrical connector can take the form of, for example, a mating electrical connector (i.e., adapted to mate with another mating electrical connector to make an electrical connection therebetween). Mating connectors can mate with one another, for example, in a male/female fashion. An electrical connector can also take the form of a cable that interconnects a mating connector with the photovoltaic element. An electrical connector can also take a form of a junction box that interconnects various electrical wires and cables associated with the photovoltaic elements, mating connectors or other electrical components such as bypass diodes. Any or all of these types of electrical connectors may be protected by a shield as described herein.

Figure 8:
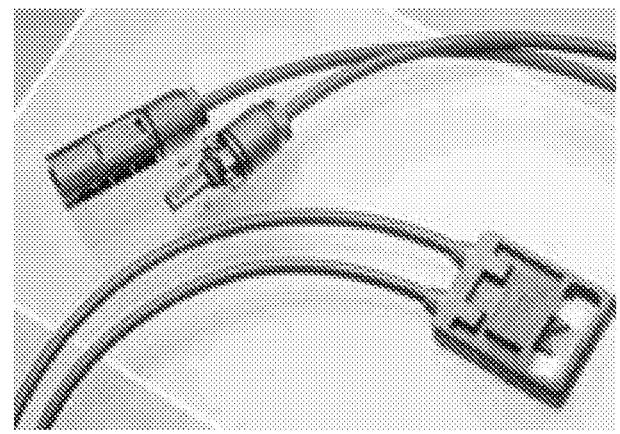
FIG. 8 is a set of pictures of electrical connectors that can be suitable for use or adapted for use in practicing various embodiments of the invention.
Figure 8:
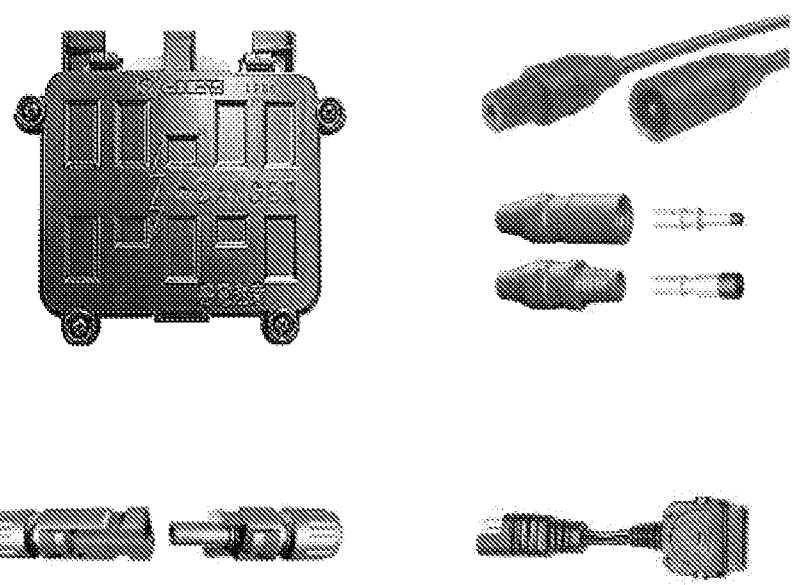

Examples of electrical connectors that can be suitable for use or adapted for use in practicing various embodiments of the invention are shown in FIG. 8. The mating connectors and junction boxes depicted are available from Kyocera, Tyco Electronics, Berwyn, Pa. (trade name Solarlok) and Multi-Contact USA of Santa Rosa, Calif. (trade name Solarline). U.S. Pat. Nos. 7,445,508 and 7,387,537, U.S. patent application Ser. Nos. 11/743,073, 12/266,498, 12/268,313, 12/359,978 and U.S. Provisional Patent Application Ser. No. 61/121,130, each of which is hereby incorporated herein by reference in its entirety, disclose electrical connectors for use with photovoltaic roofing products. All of these electrical connectors are relatively flat and low in profile compared to some other connectors, but they can still be thicker than typical flexible roofing materials such as, for example, asphalt shingles, and would generally have a larger thickness dimension than a photovoltaic laminate structure. Accordingly, their use with typical flexible roofing materials would result in undesirable appearance and stress/wear points, as described above. Accordingly, such electrical connectors can be useful in practicing various aspects of the present invention. Electrical connectors desirably meet UNDERWRITERS LABORATORIES and NATIONAL ELECTRICAL CODE standards.

In certain embodiments, the roofing substrate has formed therein a recess shaped to at least partially receive the electrical connector. The recess can be formed, for example, in a top or a bottom surface of the photovoltaic roofing element, or along a side of the photovoltaic roofing element (e.g., as a "notch" or a "cutout").

The electrical connector and the shield can in certain embodiments be disposed in the recess. For example, the electrical connector and the shield can in certain embodiments be affixedly disposed in the recess. In certain embodiments, the electrical connector can be generally movable with respect to the recess, and disposed in the recess when the photovoltaic roofing element is installed. For example, the electrical connector can be a cable and/or a mating electrical connector that is movable in order to be connected to an adjacent photovoltaic roofing element or to an electrical bus or wiring system for collection of electrical power, then disposed in the recess once connected. In certain embodiments of the invention, the electrical connector and the shield have a thickness dimension that is greater than the thickness of the photovoltaic element, and the roofing substrate has a recess formed therein of appropriate size and shape to receive the volume of the electrical connector and the shield when the photovoltaic roofing element is installed on a roof. In some cases, the recess is formed in the roofing substrate of a given photovoltaic roofing element, and disposed so as to contain at least part of the volume of the electrical connector and the shield of the same photovoltaic roofing element. In other embodiments, the recess is disposed so as to contain at least part of the volume of an electrical connector and a shield of a different photovoltaic roofing element, for example an underlying photovoltaic roofing element, or an overlying photovoltaic roofing element.

In certain embodiments of the invention, the recess can be disposed to retain an electrical connector and a shield inlayed in the material so that a bump or surface irregularity that may otherwise telegraph through to a shingle of an overlying course is avoided. In certain embodiments, the recess is formed as a cutout or notch in some, but not all, layers of a multilayer laminate roofing substrate (e.g., an asphalt shingle). In some embodiments, a continuous notch running the length of the shingle is provided that can contain one or more connectors (e.g., cables and mating connectors) along with their associated shields. In some cases, additional shingle shim material may be employed in the vicinity of the electrical connector and the shield to offset a thickness differential in the roofing product near them.

Figure 9:
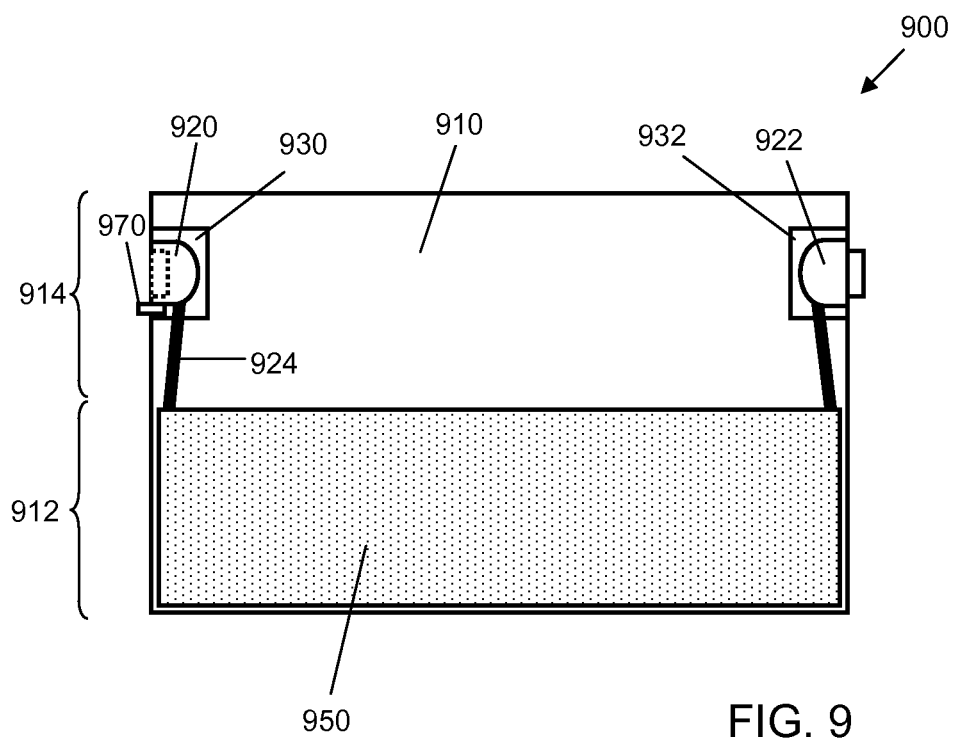
FIG. 9 is a schematic top view.
Figure 10:
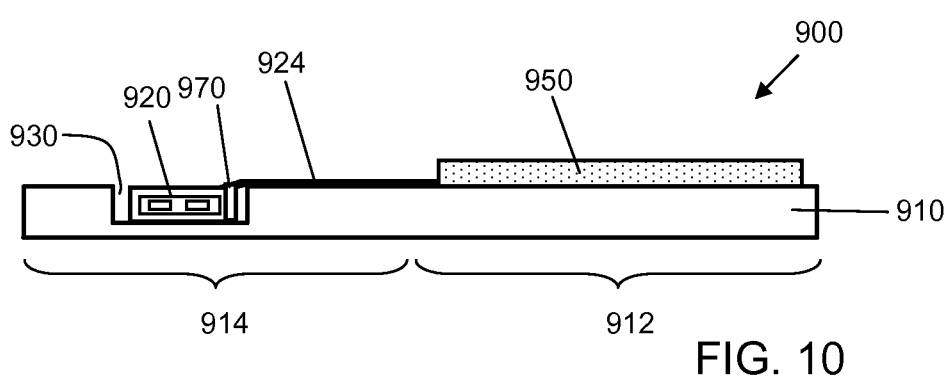
FIG. 10 a schematic cross-sectional view of a photovoltaic roofing element according to one embodiment of the invention.

FIG. 9 is a schematic top view and FIG. 10 is a schematic side view of a photovoltaic roofing element according to one embodiment of the invention. Photovoltaic roofing element 900 includes a roofing substrate 910 (here, an asphalt shingle) having a exposure zone 912 (i.e., the part of the shingle that will be exposed when installed on a roof) and a headlap zone 914 (the part that will be covered by an overlying course of shingles). A photovoltaic element 950 is disposed on the flexible roofing substrate in the exposure zone. The photovoltaic element further includes two electrical connectors (here, mating electrical connectors) 920 and 922, which are operatively coupled to the photovoltaic element 950, in this embodiment through wires 924. The mating electrical connectors in this embodiment mate in a male/female fashion. Disposed in the recess is a shield 970, attached to the down-roof side of the female connector 920, as described above. The roofing substrate has recesses 930 and 932 formed therein, which are adapted to at least partially receive the mating electrical connectors 920 and 922.

In the embodiment of FIGS. 9 and 10 the electrical connectors are disposed entirely within the recesses. In other embodiments, the electrical connectors can be only partially disposed within the recesses; that is, some portion of an electrical connector can in some circumstances protrude from the recess. The electrical connectors can be affixed into the recesses, or alternatively can be merely held within them.

In cases where no recess is provided for the wires connecting the photovoltaic element to the mating electrical connector, they are desirably relatively flat in cross-sectional shape, so as not to cause a significant bump in an overlying roofing element. In certain other embodiments, the wires are disposed within the flexible roofing substrate itself.

The recess can be formed in a variety of surfaces of the roofing substrate. For example, as shown in FIGS. 9 and 10, the recess can be formed in a top surface of the roofing substrate. As shown in FIG. 10, in certain embodiments, the recess does not go through the thickness of the entire asphalt shingle.

Figure 11:
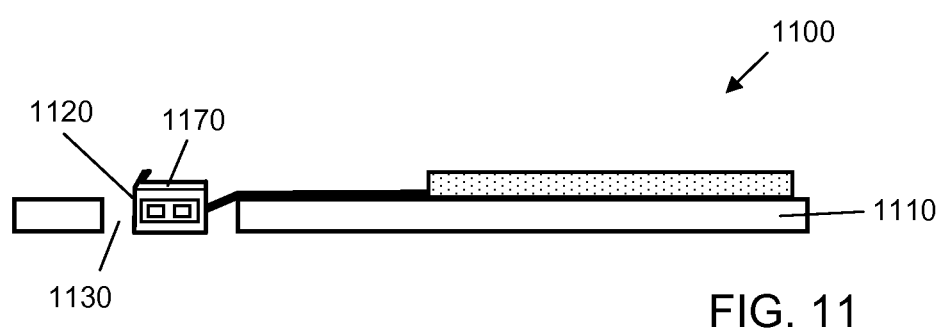
FIG. 11 is a schematic cross-sectional view of a photovoltaic roofing element according to another embodiment of the invention.

Another embodiment is shown in cross-sectional view in FIG. 11. In this photovoltaic roofing element 1100, the top view is similar to that shown in FIG. 9, but the recess is formed in the side of the roofing substrate 1110, and the recess 1130 goes all the way through the roofing substrate. Also, in this embodiment, the shield 1170 is integrally formed with connector 1120, for example, by injection molding of a single plastic piece. This configuration can be advantaged in that it would prevent pooling of any water that is blown-back up underneath the overlying roofing elements.

A recess can be formed through less than all layers of a multilayer asphalt shingle (or other roofing substrate). For example, the recess can be formed as a hole or cutout in at least one, but not all the layers of a multilayer asphalt shingle.

Figure 12:
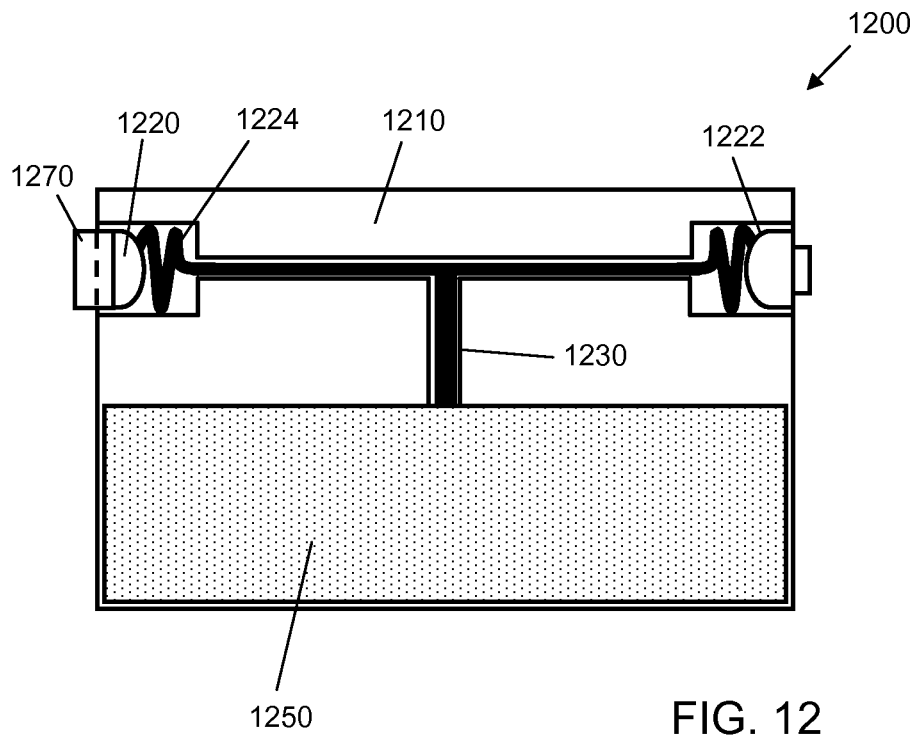
FIGS. 12 and 13 are schematic top views of photovoltaic roofing elements according to certain embodiments of the invention.

Another embodiment is shown in top schematic view in FIG. 12. In photovoltaic roofing element 1200, the flexible roofing substrate 1210 has a recess 1230 which is adapted to at least partially receive not only the mating electrical connector 1220, which has shield 1270 on its top surface as described above, and electrical connector 1222, but also the wires 1224 that operatively connect them to the photovoltaic element 1250. In this embodiment, the wires can be relatively thick, but still not cause distortion of overlying layers of roofing materials. In other embodiments, the recess can be shaped to at least partially receive other electrical connectors, such as bypass diodes and junction boxes.

Figure 13:
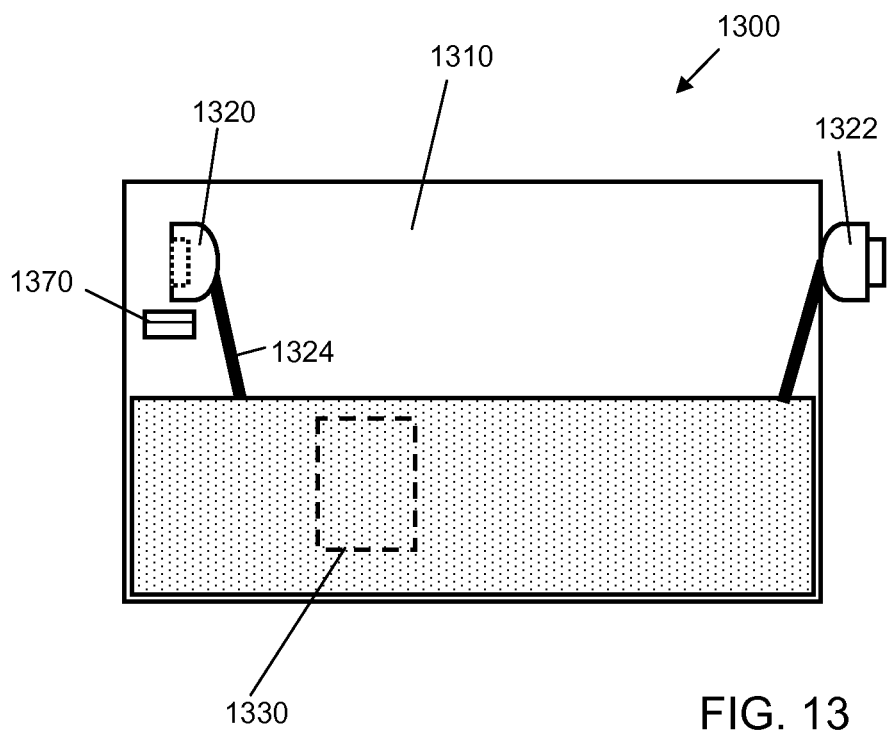

Another embodiment is shown in top schematic view in FIG. 13. In this embodiment, the recess 1330 is formed in a bottom surface of the flexible roofing substrate. The mating electrical connectors 1320, 1322, the shield 1370 disposed on the roofing substrate down-roof of electrical connector 1320, and the wires 1324 are disposed on the top surface of the flexible roofing substrate 1310. In this embodiment, the recess is of a shape to at least partially receive the electrical connectors. However, when installed, the mating electrical connectors of this photovoltaic roofing element 1300 will not be disposed within the recess 1330. Rather, as will be described in more detail with reference to FIG. 21, in use the recess 1330 of this photovoltaic roofing element can at least partially receive the electrical connectors of a similar, underlying photovoltaic roofing element, and the electrical connectors 1320, 1322 of this photovoltaic roofing element 1330 can be at least partially received by the recess of a similar, overlying photovoltaic roofing element.

Figure 14:
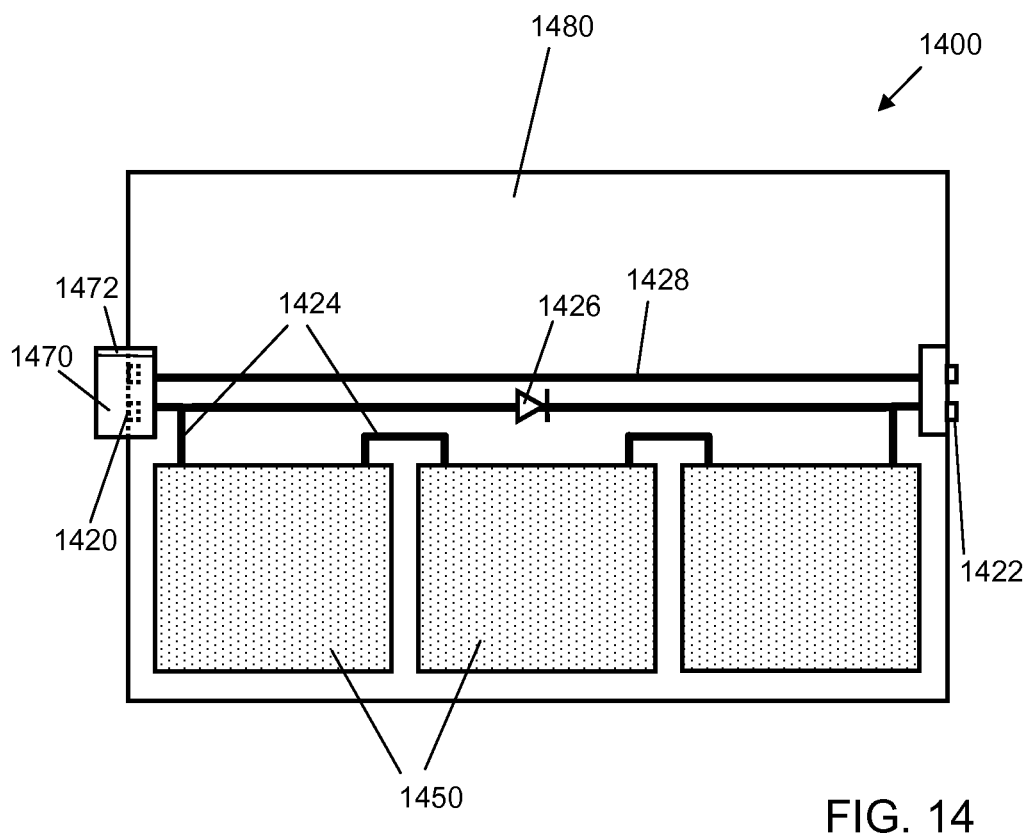
FIG. 14 is a schematic top view.
Figure 15:
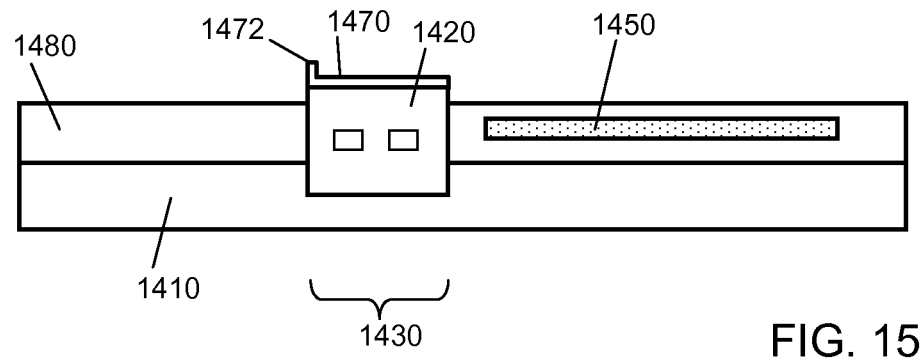
FIG. 15 a schematic cross-sectional view of a photovoltaic roofing element according to one embodiment of the invention.

In other embodiments, as shown in top view in FIG. 14, and cross-sectional view in FIG. 15, the electrical connector is partially received within the recess, yet protrudes partially from the top face of the photovoltaic roofing element. In photovoltaic element 1400, the photovoltaic elements 1450 and their associated series interconnection wiring 1424, bypass diode 1426 and return electrical path wiring 1428, along with mating electrical connectors 1420 and 1422 are contained within a laminate or encapsulated structure 1480, from which the mating electrical connectors protrude. Shield 1470, which has flange 1472 formed thereon as described above, is disposed on the top surface of connector 1420. The return electrical path wiring can allow for the mating electrical connectors to not only interconnect the photovoltaic elements of adjacent photovoltaic roofing elements in series, but also allow provide the return path for built-up power to the larger electrical system. The return path wiring can be as described in U.S. Patent Application Publication no. 2009/0242015, which is hereby incorporated herein by reference in its entirety. In the embodiment of FIGS. 14 and 15, the mating electrical connectors protrude from both the bottom and top faces of the laminate structure. In other embodiments, the mating electrical connectors protrude only from the top surface, or only from the bottom surface of the laminate or encapsulated structure. In the embodiment of FIGS. 14 and 15, the laminate structure 1480 is disposed on a roofing substrate 1410. The roofing substrate 1410 has a recess 1430 formed therein to receive the mating electrical connector 1420; as well as a second recess formed therein (not shown in the cross-sectional view of FIG. 15) to receive the mating electrical connector 1422. In certain embodiments, for example when the electrical connectors protrude significantly from the top face of the laminate or encapsulated structure, the flexible roofing substrate 1410 can have a recess formed in its bottom surface, as described above with reference to FIG. 13 and below with reference to FIG. 21.

Figure 16:
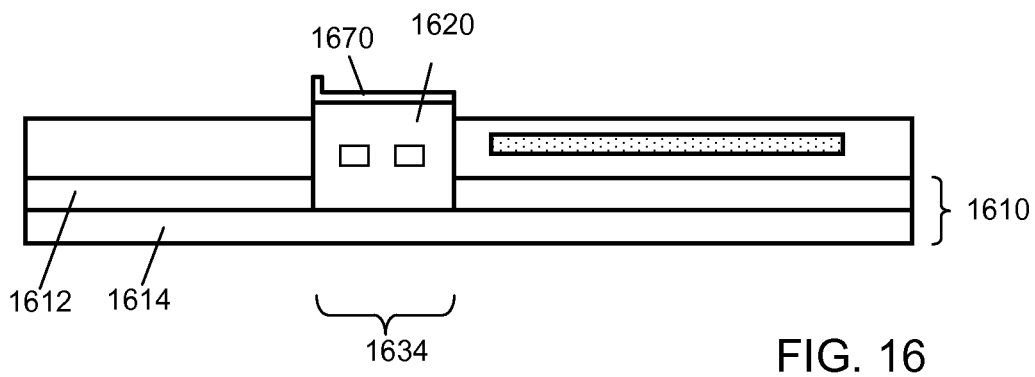
FIG. 16 is a schematic cross-sectional view of a photovoltaic roofing element according to another embodiment of the invention.

In certain embodiments, the flexible roofing substrate itself is made from a plurality of layers of material. In such embodiments, the various layers can be cut or notched differently to form the recess. For example, in the embodiment of FIG. 16, the roofing substrate 1610 includes two layers of material (e.g., asphalt-impregnated fiberglass web, as used in conventional roofing shingles). In the first layer 1612, a notch 1634 (shown as a discontinuity in this cross-sectional view) is cut to receive the electrical connector 1620 (which has shield 1670 attached thereto). The second layer 1614 underlies the first layer and the electrical connector. The overall effect of the notch 1634 and the underlying layer 1614 is that of a recess formed in the top surface of the flexible roofing substrate, as described above.

In certain embodiments of the invention, the wiring that operatively connects the mating electrical connectors to the photovoltaic element can have sufficient slack to allow the connectors to be lifted away from the flexible roofing substrate for easy interconnection with the mating electrical connector of another photovoltaic roofing element, or into a larger electrical system. In some such embodiments, the slack wire can be received by a recess in a roofing substrate (i.e., either in the roofing substrate of its own photovoltaic roofing element, or the roofing substrate of an overlying photovoltaic roofing element, as described above with reference to FIG. 13 and below with reference to FIG. 21. An example of this is shown in FIG. 12, in which the slack in wiring 1224 is received by recess 1230.

Figure 17:
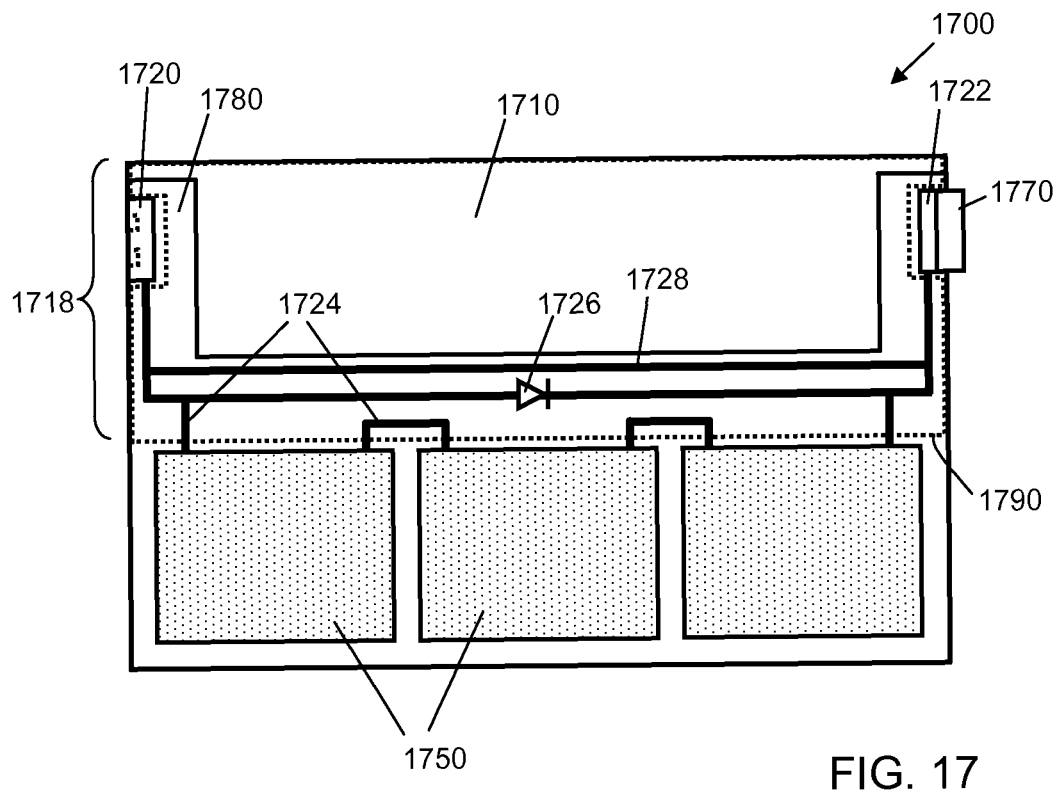
FIG. 17 is a schematic top view.
Figure 18:
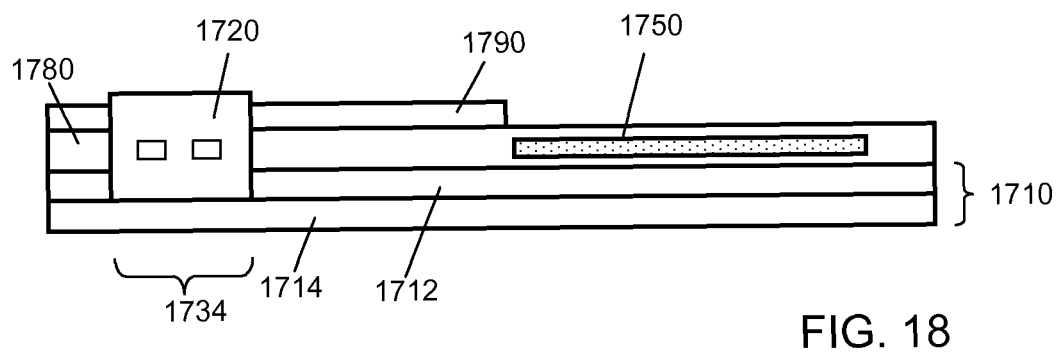
FIG. 18 a schematic cross-sectional view of a photovoltaic roofing element according to another embodiment of the invention.

FIG. 17 is a top schematic view, and FIG. 18 is a cross-sectional schematic view of a photovoltaic roofing element 1700 according to another embodiment of the invention. In this embodiment, the laminate or encapsulate structure 1780 has a reduced volume of encapsulant or laminating materials in the headlap zone of the structure (i.e., there is no encapsulant or laminating material in most of the headlap zone 1718 of the photovoltaic roofing element 1700). Such an arrangement can make more efficient use of costly encapsulant or laminating materials by encapsulating or laminating primarily the parts of the structure that include electrical wiring or photovoltaic materials, and generally avoiding the use of encapsulant or laminate materials in portions of the structure that will not be exposed to the weather. In other embodiments, wires or cables can connect the mating electrical connectors to a laminated or encapsulated photovoltaic element.

In the photovoltaic roofing element of FIGS. 17 and 18, the laminate or encapsulate structure 1780 includes photovoltaic elements 1750, bypass diode 1726, return path wiring 1728 and wiring 1724, as well as mating electrical connectors 1720, 1722 (which includes shield 1770 as described above). The mating electrical connectors protrude both and above and below the laminate or encapsulate structure. The flexible roofing substrate 1710 includes a first layer 1712 which has a notch 1734 cut therein to receive the mating electrical connector 1720, and a second layer 1714 which underlies the first layer. In certain embodiments, the first layer merely has a recess formed therein, instead of a notch formed through its entire thickness. The second layer does not have notches in the vicinity of the mating electrical connectors, thus providing closure and a water and weather proofing of the photovoltaic roofing element. The photovoltaic roofing element 1700 also includes a top layer of flexible roofing material 1790 (shown in dotted outline in FIG. 17) in the headlap zone, which has a notch formed therein to accommodate the mating electrical connectors. In this embodiment, the mating electrical connectors protrude only slightly above the top layer of flexible roofing material, and when installed has little effect on the aesthetics of an overlying photovoltaic roofing element. In other embodiments, the second layer of the flexible roofing substrate has a hole cut therein, to form a recess formed in the bottom surface of the flexible roofing substrate, as described above with reference to FIG. 13 and below with reference to FIG. 21.

Figure 19:
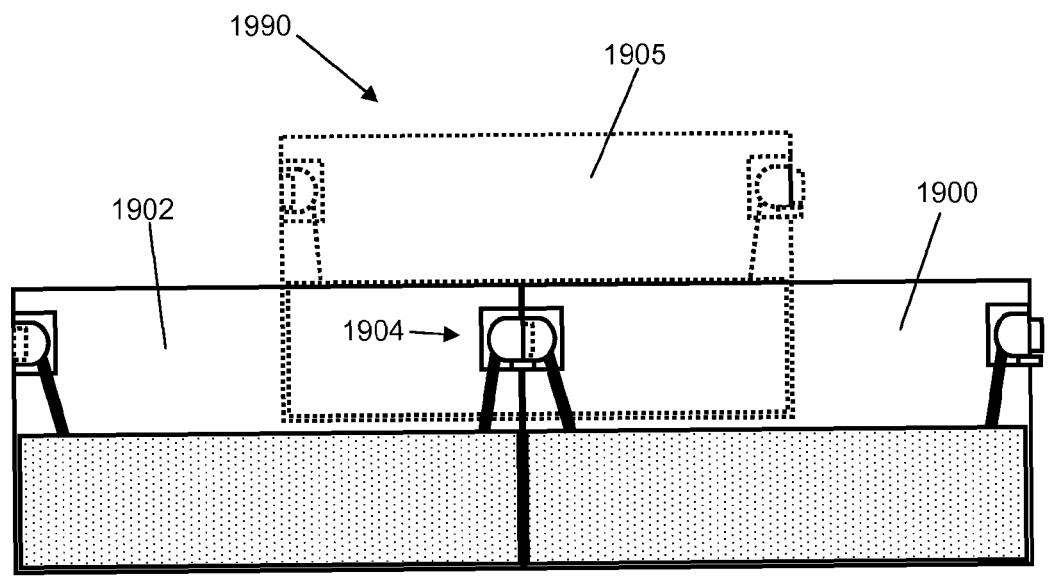
FIG. 19 is a partial schematic top view of a photovoltaic roofing system according to one embodiment of the invention.

Another aspect of the invention is shown in partial schematic top view in FIG. 19. Photovoltaic roofing system 1990 includes a first and a second photovoltaic roofing element 1900 and 1902 electrically interconnected with one another, each of which comprises a roofing substrate, a photovoltaic element disposed on the roofing substrate, an electrical connector operatively coupled to the photovoltaic element, and a shield, as described above. Photovoltaic roofing system 1990 further comprises a third photovoltaic roofing element 1905, shown in dotted outline, which comprises a roofing substrate, a photovoltaic element disposed on the roofing substrate, and an electrical connector operatively coupled to the photovoltaic element, as described above. The third photovoltaic roofing element 1905 is disposed so as to cover the interconnected electrical connectors of the first and second photovoltaic roofing element (shown generally by reference number 1904). In certain embodiments, the electrical connectors of the first and second photovoltaic roofing elements are at least partially disposed within a recess formed in the roofing substrate of the first and/or second photovoltaic roofing elements (e.g., in a top or along a side thereof); within a recess formed in the roofing substrate of the third photovoltaic roofing element (e.g., in a bottom surface thereof); or within a recess formed in the roofing substrate of the first and/or second photovoltaic roofing elements and within a recess formed in the roofing substrate of the second photovoltaic roofing element. The third photovoltaic roofing element can be electrically interconnected to the first and second photovoltaic roofing elements, for example, by other photovoltaic roofing elements (not shown) and/or a wiring system (not shown). The photovoltaic roofing system can, for example, be disposed on a roof deck.

Figure 20:
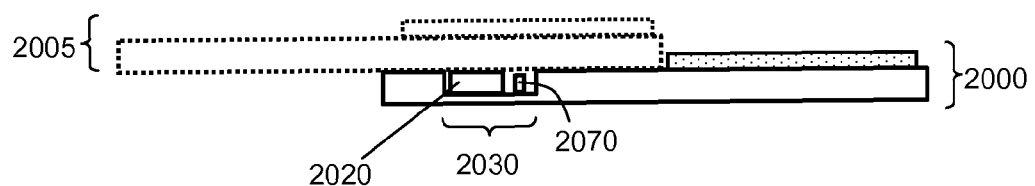
FIGS. 20 and 21 are partial schematic cross-sectional views of photovoltaic roofing systems according to certain embodiments of the invention.

For example, in certain embodiments, as shown in side cross-sectional view in FIG. 20, the roofing substrate of the first photovoltaic roofing element 2000 has a recess 2030 formed in its top surface or along a side, in which the electrical connector of the first photovoltaic roofing element is at least partially disposed. Such a photovoltaic roofing element is described, for example, with reference to FIGS. 9 and 10, above. In FIG. 20, the electrical connector 2020 and shield 2070 of first photovoltaic roofing element 2000 is covered by second photovoltaic roofing element 2005 (shown in dotted outline). As the person of skill in the art will understand, the recesses (e.g., cutouts or notches) can advantageously be disposed so that, when installed, they are aligned in a way to minimize the formation of water pathways through the roofing substrates.

The shield can be disposed so that it spans two adjacent photovoltaic roofing elements, for example to protect the interface of an electrical connection made across the photovoltaic roofing elements. Accordingly, another embodiment of the invention is a photovoltaic roofing array comprising a first photovoltaic roofing element and a second photovoltaic roofing element disposed adjacent one another, the first photovoltaic roofing element and the second photovoltaic roofing element each comprising a roofing substrate; a photovoltaic element disposed on the roofing substrate; and an electrical connector operatively connected to the photovoltaic element, the electrical connector having a down-roof side and an electrical terminus, the electrical connectors of the first photovoltaic roofing element and the second photovoltaic roofing element being interconnected at an interface; and a shield disposed adjacent the interface between the electrical connectors of the first and second photovoltaic roofing elements on its down-roof side, its top side, or both. In one embodiment, the shield is in substantial contact with the roofing substrate. For example, the shield can be a separate element attached to the roofing substrate and extending away from the substrate, positioned in front of the terminus of the electrical connector. In certain embodiments, the shield is disposed across the first photovoltaic roofing element and the second photovoltaic roofing element. In other embodiments, it is disposed on one or the other of them. The shield can be integrally formed with the roofing substrate; integrally formed with the connector, or attached separately. The person of skill in the art can adapt the shield configurations described above for such embodiments.

Figure 21:
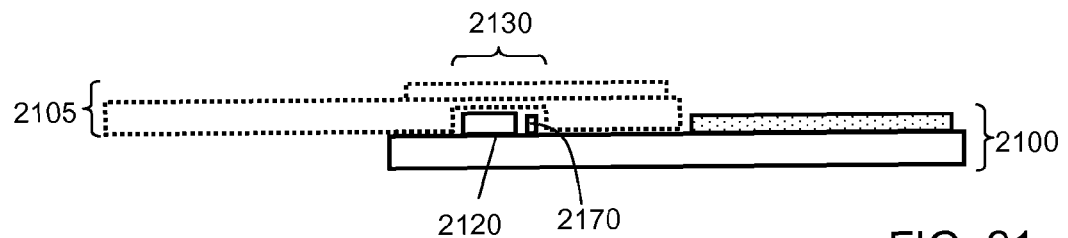

Another aspect of the invention is a photovoltaic roofing system including a first photovoltaic roofing element, the first photovoltaic roofing element comprising a roofing substrate, a photovoltaic element disposed on the roofing substrate, an electrical connector operatively coupled to the photovoltaic element and a shield disposed adjacent the electrical terminus of the electrical connector on its down-roof side, its top side, or both; and a second photovoltaic roofing element disposed adjacent the first photovoltaic roofing element, the second photovoltaic roofing element comprising: a roofing substrate having a recess formed therein, the electrical connector and the shield of the first photovoltaic roofing element being at least partially disposed in the recess, a photovoltaic element disposed on the roofing substrate, and an electrical connector operatively coupled to the photovoltaic element. For example, as shown in side cross-sectional view in FIG. 21, the roofing substrate of the second photovoltaic roofing element has a recess formed in its bottom surface, in which the electrical connector of the first photovoltaic roofing element is at least partially disposed. Such a photovoltaic roofing element is described, for example, with reference to FIG. 13, above. In FIG. 21, the electrical connector 2120 and shield 2170 of the first photovoltaic roofing element 2100 is disposed in a recess 2130 formed in the bottom side of the roofing substrate of the second photovoltaic roofing element 2105 (shown in dotted outline). While not shown in this cross-sectional view (due to the lateral offset between the photovoltaic roofing elements as shown in FIG. 19), the second photovoltaic roofing element can have a electrical connector, and the first photovoltaic roofing element can have a recess formed in the bottom surface of its roofing substrate. For example, the first and second photovoltaic roofing elements can be the same. As the person of skill in the art will appreciate, the position of the recess will depend on the positions of the electrical connectors as well as the intended configuration (i.e., lateral offset between courses, degree of overlap between courses) of the photovoltaic roofing elements in a larger photovoltaic roofing system. For example, if a photovoltaic roofing element has its electrical connectors at a higher position (i.e., closer to the roof ridge end of the photovoltaic roofing element), a recess on the bottom surface would be at a different location than for embodiments having electrical connectors at a lower position. For photovoltaic roofing elements to be applied with a consistent lateral offset during installation, a recess can be appropriately located so as to be able to receive the electrical connectors and shield of an underlying course. For photovoltaic roofing elements that are to be applied with an alternating offset, such as in a racked-type installation, it may be that they include two recesses, one toward a left end and one toward a right end so that the same photovoltaic roofing elements may be used as courses are built up on the roof with alternating left and right offsets in the installation pattern.

Figure 22:
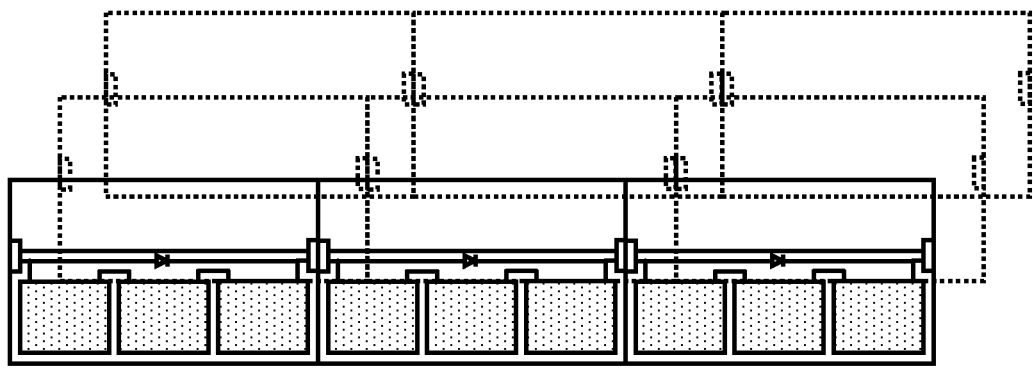
FIGS. 22 and 23 are partial schematic top views of photovoltaic systems according to certain embodiments of the invention.

FIG. 22 shows a photovoltaic roofing system comprising an array of photovoltaic roofing elements as described herein. The photovoltaic roofing elements are disposed in a laterally-offset fashion as sequential courses are applied on a roof deck (roof deck not shown). As the person of skill in the art will understand, the number of courses and the number of photovoltaic roofing elements per course will depend on the size of the roof area to be covered, and may include more or fewer courses than three, and more or fewer photovoltaic roofing elements per course than three. In FIG. 22, the upper two courses are shown in dotted outline, so as to show the locations of the structural details of the underlying courses, including the locations of the electrical connectors and interconnections between photovoltaic roofing elements. As described in detail above, the electrical connectors can be disposed within recesses formed in the photovoltaic roofing elements of which they are a part, within recess formed in overlying photovoltaic roofing elements, or (advantageously for relatively thick electrical connectors) both.

Figure 23:
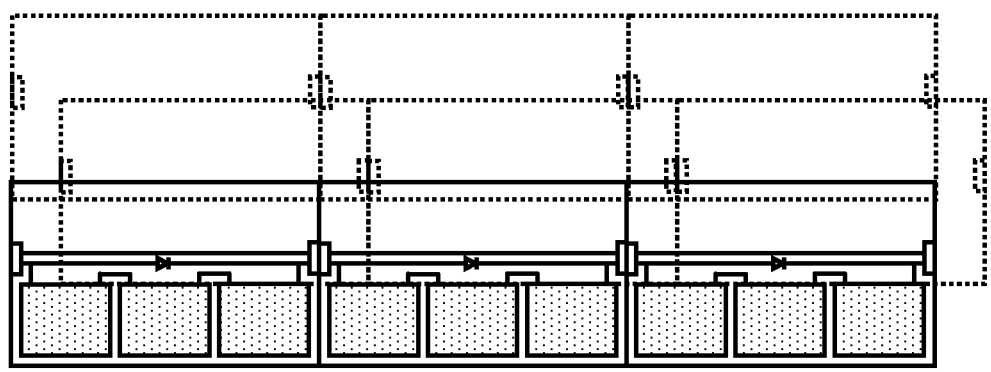

FIG. 23 shows a photovoltaic roofing system similar to that of FIG. 22, in which the photovoltaic roofing elements are disposed in a racked configuration, in which the laterally offset disposition as sequential courses are applied on a roof deck (roof deck not shown) alternates from left to right relative to the underlying course moving up the roof.

One aspect of the invention is a photovoltaic roofing element including a flexible roofing substrate, the roofing substrate including a base of roofing material having a top surface, the top surface having a headlap zone and an exposure zone, and one or more layers of shim material disposed on the top surface of the base in the headlap zone; a photovoltaic element disposed on the top surface of the base; an electrical connector operatively connected to the photovoltaic element and disposed on the top surface of the base, and a shield disposed adjacent the electrical terminus of the electrical connector on its down-roof side, its top side, or both, wherein the one or more layers of shim material have a total thickness at least about as great as the thicknesses of the electrical connector and the shield. That is, the combined thicknesses of the one or more layers of shim material is at least about as great as the thickness of the combination of the electrical connector and the shield.

For example, the total thickness of the one or more layers of shim material can be about equal to (e.g., within 20% of, or even within 10% of) the thickness of the combination of the electrical connector and the shield. As used herein, the headlap zone is the area that is covered by overlying courses of roofing elements when installed; and the exposure zone is the area that is not covered by overlying courses of roofing elements when installed.

In one embodiment, the one or more layers of shim material have a stair-step configuration, for example with the region of greatest thickness disposed adjacent the electrical connector. In such an embodiment, the stair-step can provide a gradual slope to an overlying roofing element.

In one embodiment, the one or more layers of shim material have a notch or recess formed therein, in which the connector and the shield are positioned.

Another aspect of the invention is a photovoltaic roofing element including a roofing substrate, the roofing substrate including a base of roofing material having a top surface and a bottom surface, the top surface having a headlap zone and an exposure zone; and one or more layers of shim material disposed on the bottom surface of the roofing substrate; a photovoltaic element disposed on the top surface of the base; an electrical connector operatively connected to the photovoltaic element and disposed on the top surface of the base; and a shield disposed adjacent the electrical terminus of the electrical connector on its down-roof side, its top side, or both, wherein the one or more layers of roofing material have a total thickness at least about as great as the thicknesses of the electrical connector and the shield.

For example, the total thickness of the one or more layers of roofing material can be about equal to (e.g., within 20% of, or even within 10% of) the thickness of the combination of the electrical connector and the shield.

In certain embodiments, the photovoltaic roofing element includes a plurality of electrical connectors, for example, mating electrical connectors, junction boxes, bypass diodes, wiring and/or cabling. Any or all of the electrical connectors can be protected by the shim layers as described herein.

In one embodiment, the one or more layers of shim material are positioned so that, when installed, the electrical connector of an underlying photovoltaic roofing element is disposed adjacent the one or more layers. In some embodiments, a sealing layer for containment and waterproofing of the connector element is provided.

In one embodiment, the one or more layers of roofing material have a stair-step configuration, for example with the region of greatest thickness positioned so that, when installed, the electrical connector of an underlying photovoltaic roofing element is disposed adjacent the region of greatest thickness.

In one embodiment, the one or more layers of roofing material have a notch or recess formed therein, positioned so that, when installed, the electrical connector of an underlying photovoltaic roofing element is disposed therein.

Figure 24:
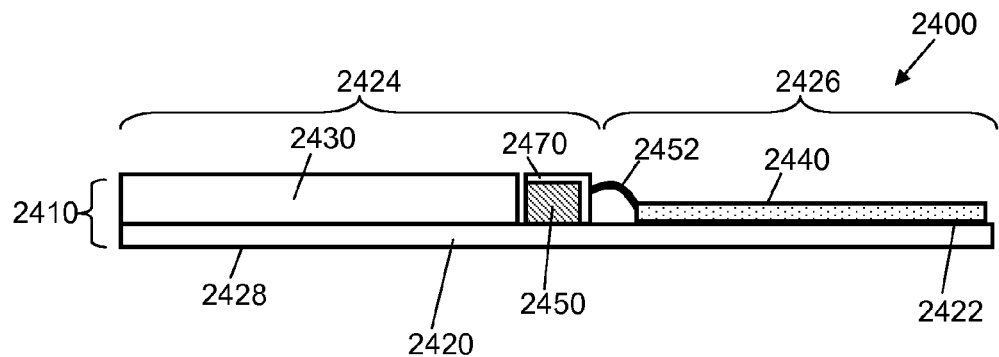
FIG. 24 is a schematic cross-sectional view.
Figure 25:
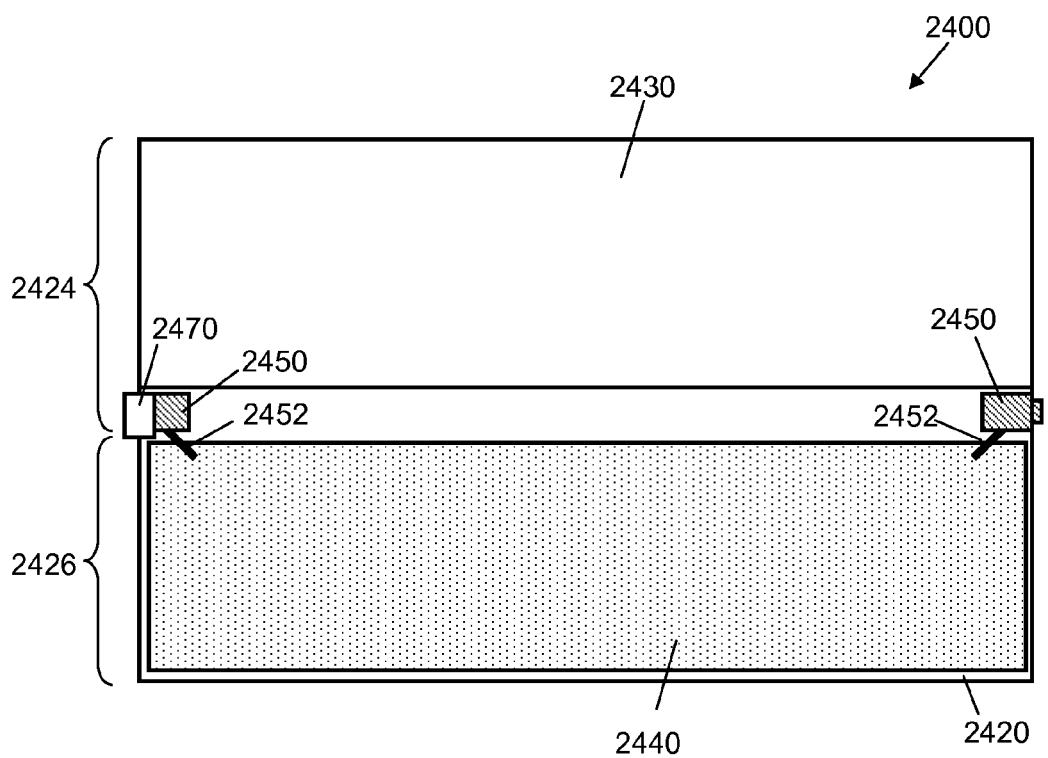
FIG. 25 is a schematic top view of a photovoltaic roofing element according to one embodiment of the invention.

One embodiment of the invention is shown in schematic cross-sectional view in FIG. 24, and in top schematic view in FIG. 25. A photovoltaic roofing element 2400 includes flexible roofing substrate 2410, which in turn includes a base of flexible roofing material 2420, which has top surface 2422 having a headlap zone 2424 and an exposure zone 2426, and a bottom surface 2428; and a layer of shim material 2430 disposed on the top surface of the base in the headlap zone. The photovoltaic roofing element 2400 also includes a photovoltaic element 2440 disposed on the top surface of the base in the exposure zone; an electrical connector 2450 disposed on the base and operatively coupled (e.g., through cable 2452) to the photovoltaic roofing element; and a shield 2470 disposed on the top and down-roof surfaces of the electrical connector, as described above. The layer of shim material 2430 has a total thickness at least about as great as the thickness of the combination of the electrical connector 2450 and the shield 2470. For example, in the embodiment of FIGS. 24 and 25, the thickness of the layer of shim material is about equal to the thickness of the combination of the electrical connector and the shield.

In the embodiment of FIGS. 24 and 25, the electrical connector and the shield are shown as sitting entirely on top of the base of flexible roofing material. In other embodiments, the electrical connector and the shield can be partially embedded in the roofing material, or be partially disposed in a recess pre-formed therein.

The cable 2452 can be round in cross section, or in certain embodiments can have a flat cross-section (e.g., a relatively flat ribbon of metal clad in a plastic coating). The person of skill in the art can select a flat cable having sufficient electrical properties for the transmission of electric power through the photovoltaic system. A flat cable can be folded over so as to lie flat, and can be easily bent to change direction. Advantageously, the flat cable can lie between photovoltaic roofing elements without causing a protrusion.

Figure 26:
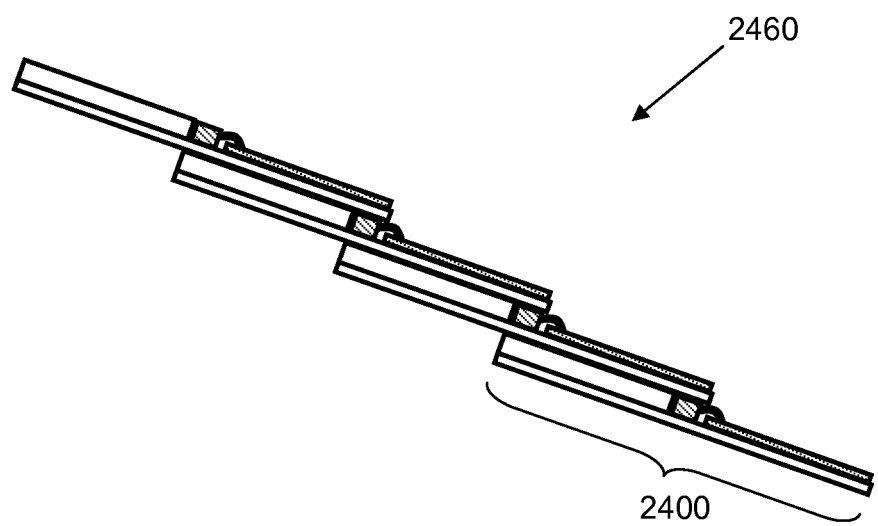
FIG. 26 is a schematic cross-sectional view of a photovoltaic roofing system according to one embodiment of the invention.

FIG. 26 is a cross-sectional schematic view of a photovoltaic roofing system 2460, which comprises a plurality of photovoltaic roofing elements 2400 as described above with reference to FIGS. 24 and 25. Overlying courses of photovoltaic roofing elements lay flat on top of the shim material, so that the electrical connector and shield themselves do not protrude, and are therefore more protected from damage. In cases where the shim material is flexible (e.g., when it is made from flexible roofing material such as that used for the base), the headlap portion of the can flex to contact the roof (not shown). The photovoltaic roofing system can be disposed on a roof deck and interconnected with an electrical system to form a photovoltaic roofing system.

Figure 27:
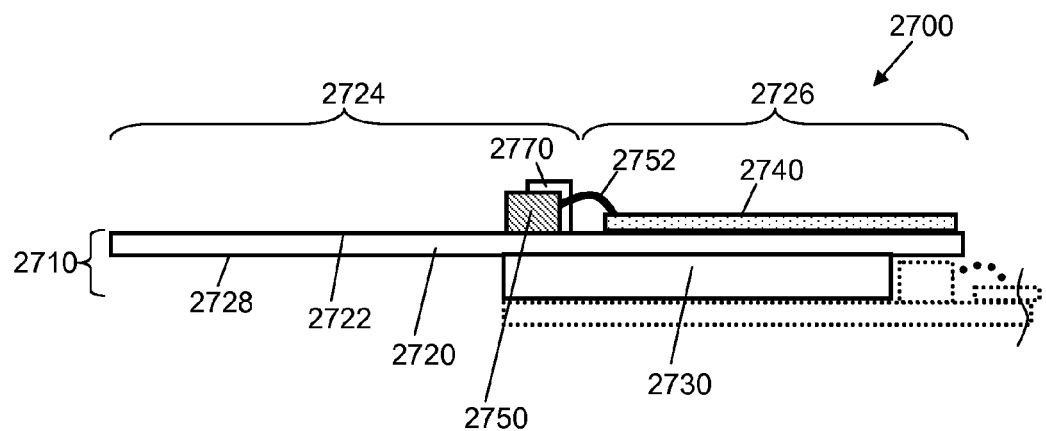
FIG. 27 is a schematic cross-sectional view.
Figure 28:
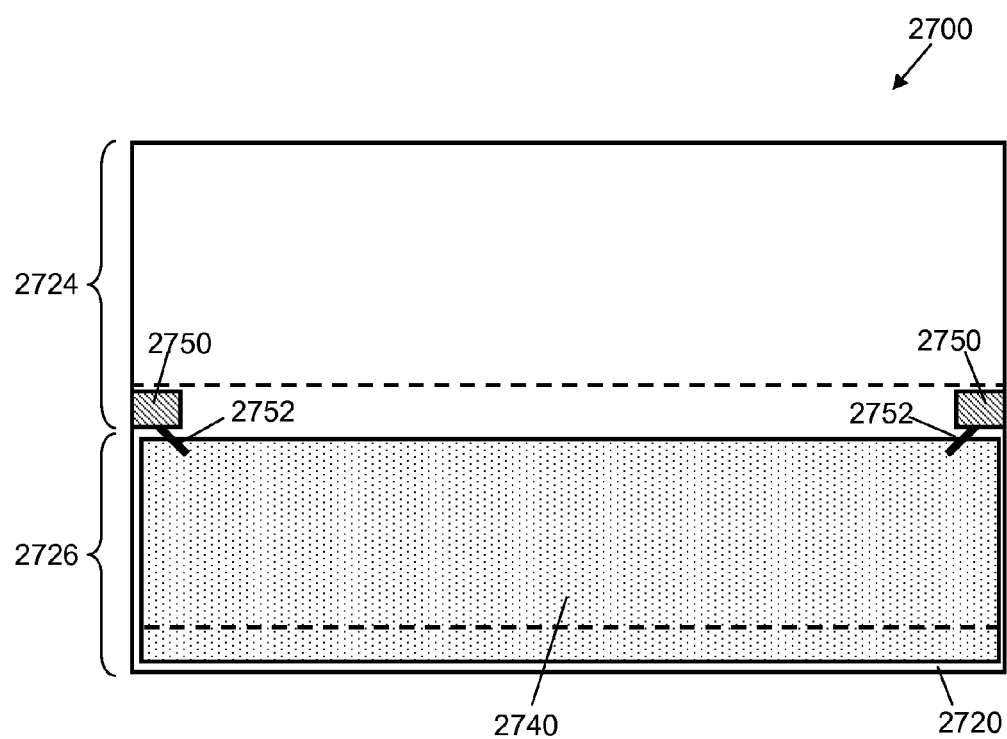
FIG. 28 is a schematic top view of a photovoltaic element according to another embodiment of the invention.

Another embodiment of the invention is shown in side schematic cross-sectional view in FIG. 27, and in top schematic view in FIG. 28. A photovoltaic roofing element 2700 includes roofing substrate 2710, which in turn includes a base of roofing material 2720, which has top surface 2722 having a headlap zone 2724 and an exposure zone 2726, and a bottom surface 2728; and a layer of shim material 2730 disposed on the bottom surface of the base. The photovoltaic roofing element 2700 also includes a photovoltaic element 2740 disposed on the top surface of the base; an electrical connector 2750 disposed on the base and operatively coupled (e.g., through cable 2752) to the photovoltaic roofing element; and a shield 2770 disposed on the top and down-roof surfaces of the electrical connector, as described above. The layer of shim material 2730 (position shown in dashed line in FIG. 28) has a total thickness at least about as great as the thickness of the electrical connector 2750. For example, in the embodiment of FIGS. 27 and 28, the thickness of the layer of shim material is about equal to the thickness of the electrical connector. Notably, in the embodiments of FIGS. 27-28, the layer of shim material is positioned so that, when installed, the electrical connector and shield of an underlying photovoltaic roofing element (shown in dotted lines) are disposed adjacent the layer of shim material.

Figure 29:
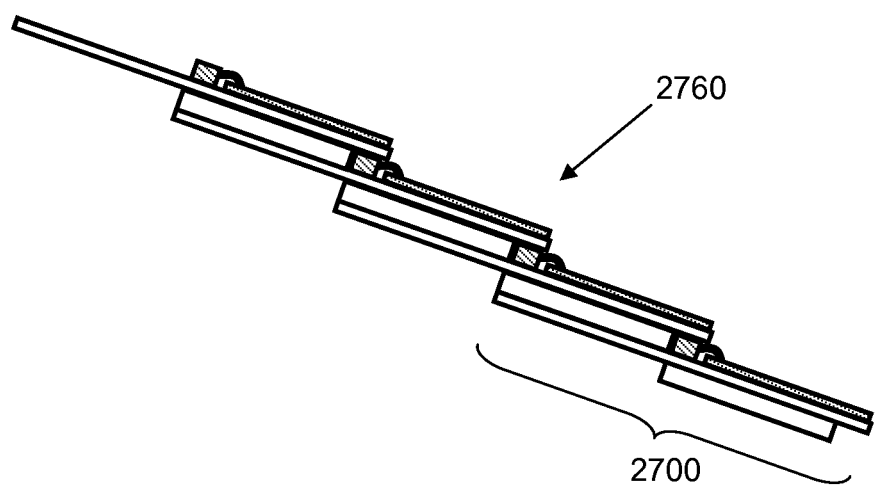
FIG. 29 is a schematic cross-sectional view of a photovoltaic roofing system according to one embodiment of the invention.

FIG. 29 is a cross-sectional schematic view of a photovoltaic roofing system 2960, which comprises a plurality of photovoltaic roofing elements 2700 as described above with reference to FIGS. 27 and 28. Overlying courses of photovoltaic roofing elements lay on top of the shim material, with any bump or protrusion formed by the shim material, so that the electrical connector and shield themselves do not protrude, and are therefore more protected from damage.

Figure 30:
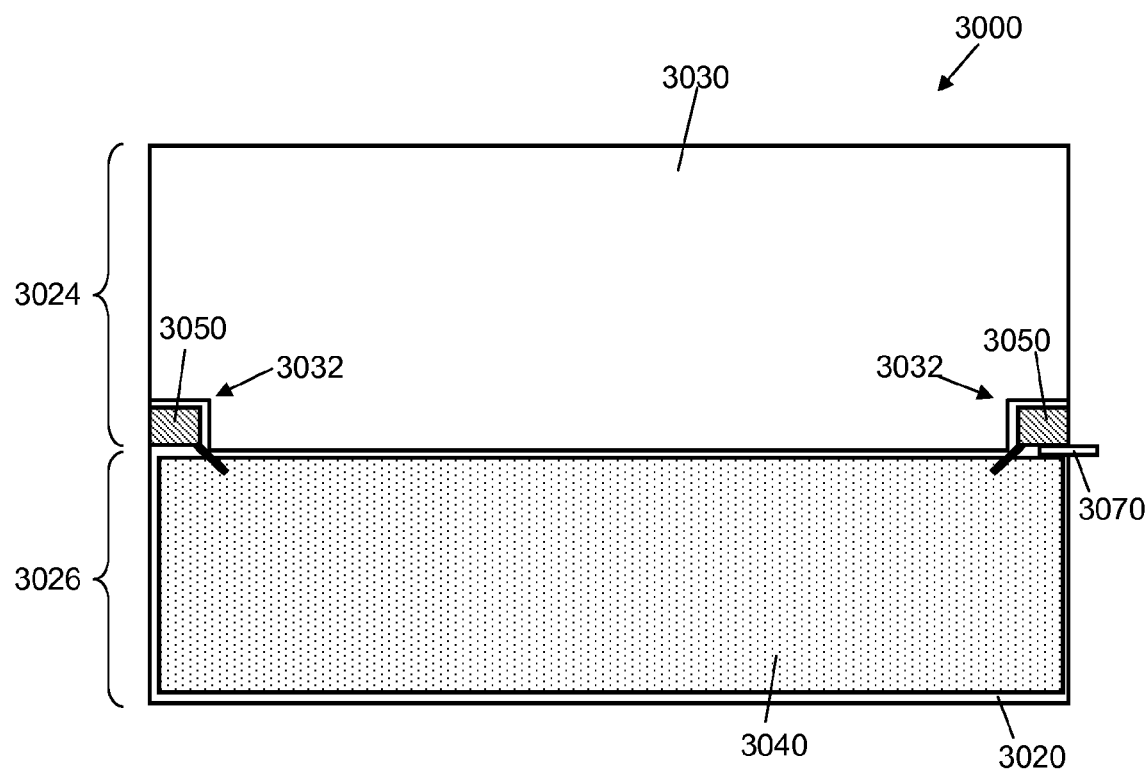
FIG. 30 is a schematic top view.

The shim material can have a shape that provides a recess (e.g., notch or cut-away) into which the connector and shield can at least partially fit. For example, as shown in top schematic view in FIG. 30, a photovoltaic roofing element 3000 includes flexible roofing substrate, which in turn includes a base of flexible roofing material 3020, which has top surface having a headlap zone 3024 and an exposure zone 3026, and a bottom surface (not shown in this view); and a layer of shim material 3030 disposed on the top surface of the base in the headlap zone. The photovoltaic roofing element 3000 also includes a photovoltaic element 3040 disposed on the top surface of the base in the exposure zone; an electrical connector 3050 disposed on the base and operatively coupled to the photovoltaic roofing element; and a shield 3070 disposed adjacent the down-roof side of the connector. The layer of shim material 3030 has a total thickness at least about as great as the thickness of the electrical connector 3050. In the embodiment of FIG. 30, the shim material has cutaways 3032 in which the electrical connectors 3050 and the shield 3070 are disposed.

The shim material can be any of a variety of materials. For example, in order to provide for ease of manufacturing in conventional roofing shingle production processes, the shim materials can be layers of asphalt shingle material. In other embodiments, the shim material can be plastic. The shim material can, for example, include recycled content, such as recycled plastic, recycled asphalt, or other recycled roofing materials. Layers of different shim materials can be mixed in a single photovoltaic roofing element according to one embodiment of the invention.

Figure 31:
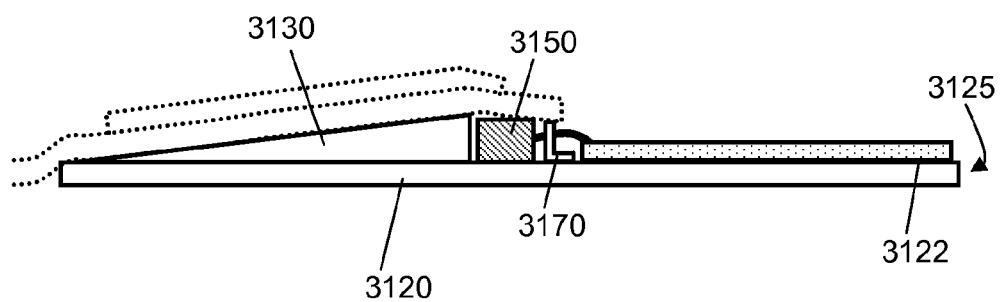
FIG. 31 is a schematic cross-sectional view of a photovoltaic element according to another embodiment of the invention.
Figure 32:
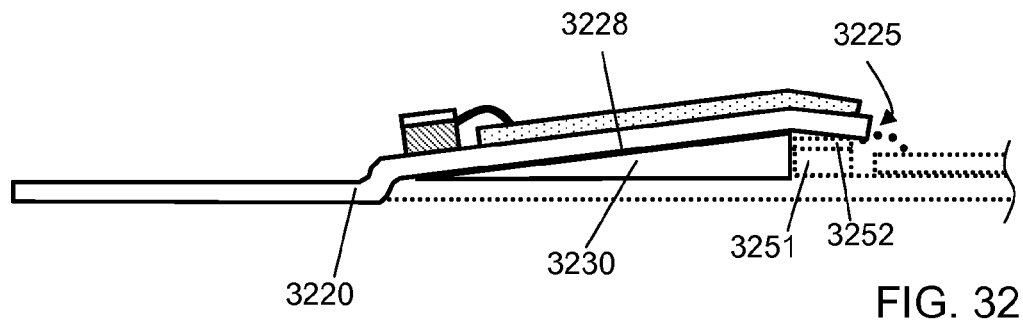
FIG. 32 is a schematic cross-sectional view of a photovoltaic element according to another embodiment of the invention.

In one embodiment, the one or more layers of shim material have a slanted profile that provides a relatively gradual slope to an overlying roofing element. For example, as shown in side schematic cross-sectional view in FIG. 31, a layer of shim material 3130 disposed on top surface 3122 of the base of roofing material 3120 is slanted at its end furthest from the down-roof edge 3125 of the base of roofing material, so that an overlying roofing element (shown in dotted outline) can more gradually slope over the electrical connector 3150 and the shield 3170. Similarly, as shown in side schematic cross-sectional view in FIG. 32, a layer of shim material 3230 disposed on the bottom surface 3228 of a base of roofing material 3220 can be slanted at its end furthest from the down-roof edge 3225 of the base of roofing material, so that the base of roofing material can more gradually slope over the electrical connector 3251 and the shield 3252 of an underlying photovoltaic roofing element (shown in dotted line).

Figure 33:
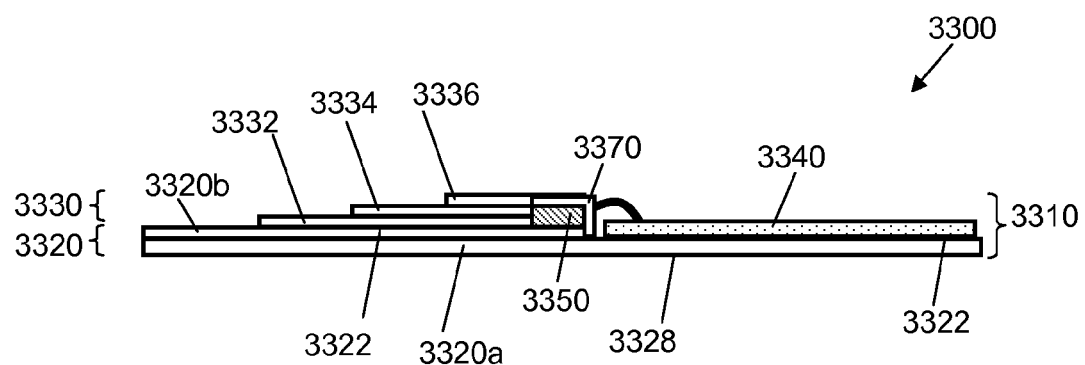
FIG. 33 is a schematic cross-sectional view.
Figure 34:
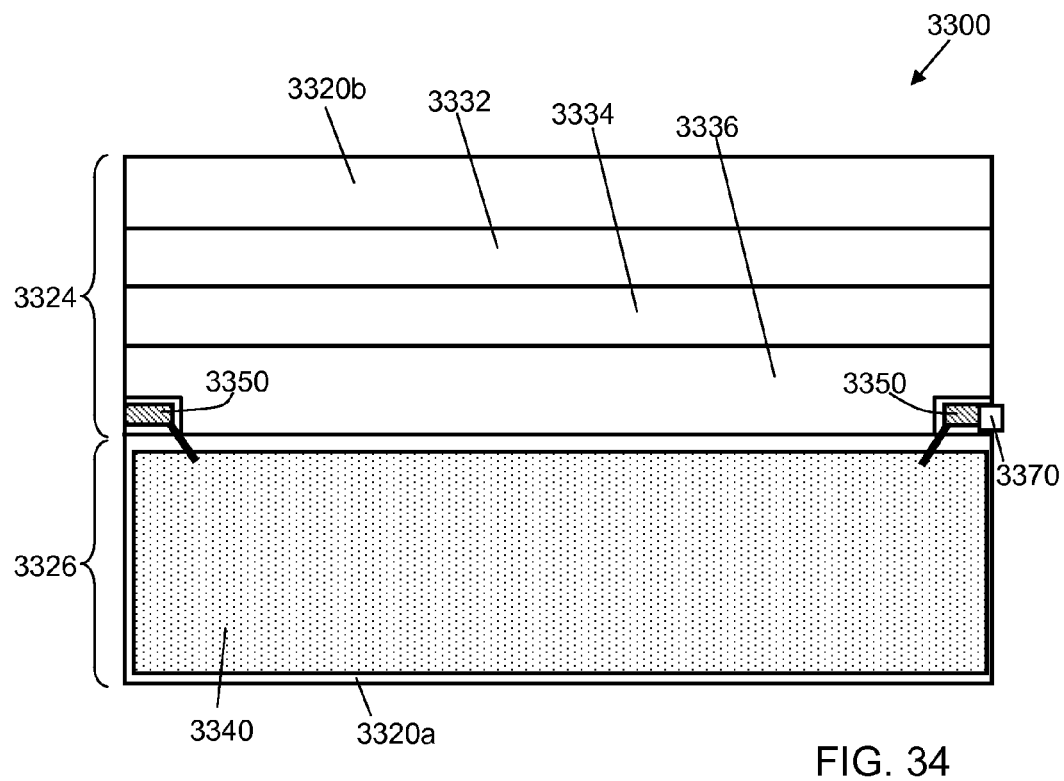
FIG. 34 is a schematic top view of a photovoltaic roofing element according to another embodiment of the invention.

In another embodiment, the one or more layers of shim material have a stair-step profile. The stair-step profile can provide a relatively gradual slope as described above with reference FIGS. 31 and 32, and can be made more simply, for example, using methods used conventionally in the production of roofing products. In one embodiment, shown in schematic side view in FIG. 33 and in schematic top view in FIG. 34, photovoltaic roofing element 3300 includes roofing substrate 3310, which in turn includes a base of roofing material 3320, which has top surface 3322 having a headlap zone 3324 and an exposure zone 3326, and a bottom surface 3328. Base 3320 in this embodiment is made of two layers of roofing material (e.g., reinforced asphalt), a first layer 3320a that forms the bottom of the entire photovoltaic roofing element, and a second layer 3320b that is formed only in the headlap zone. The roofing substrate 3310 further includes a stack 3330 of three layers of shim material 3332, 3334 and 3336 disposed in a stair-step configuration on the top surface of the base in the headlap zone. The layers 3332, 3334 and 3336 have corners cut out to form recesses for electrical connectors. The photovoltaic roofing element 3300 also includes a photovoltaic element 3340 disposed on the top surface of the base; an electrical connector 3350 disposed on the base (here, on the second layer 3320b) and operatively coupled to the photovoltaic roofing element; and a shield 3370. The stack of shim material 3330 has a total thickness at least about as great as the thickness of the electrical connector 3350. For example, in the embodiment of FIGS. 33 and 34, the total thickness of the layers of shim material is about equal to the thickness of the combination of the electrical connector and the shield. The electrical connector and the shield are disposed in a cutout region of the layers of shim material. In such embodiments, the roofing substrate and shim materials can be formed from reinforced bituminous materials, like conventional (fiber) glass-reinforced or polyester or polyester/fiber glass composite asphalt materials.

In one embodiment, for example, a photovoltaic roofing element as described above with reference to FIGS. 33 and 34 has an overall height (i.e., distance down the roof from the top of the headlap zone 3324 to the bottom of the exposure zone 3326) of about 18". The first layer 3320a of the base has a height of 18", and the second layer 3320b has a height of 9.625". The three shim layers 3332, 3334, 3336 have heights of 7", 5" and 3", respectively.

Figure 35:
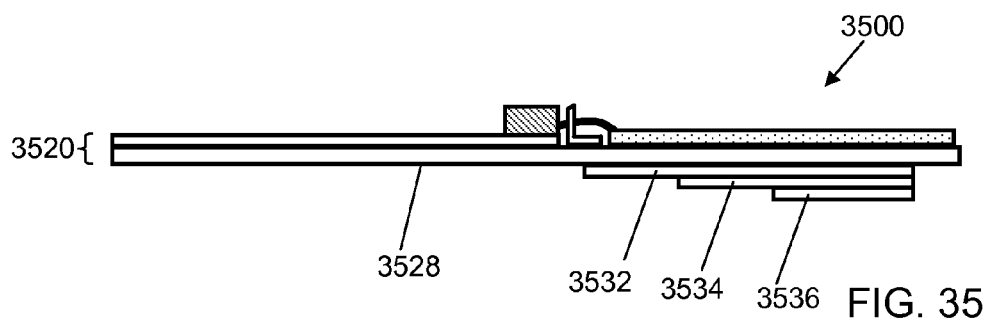
FIGS. 35 and 36 are schematic cross-sectional views of photovoltaic roofing elements according to other embodiments of the invention.
Figure 36:
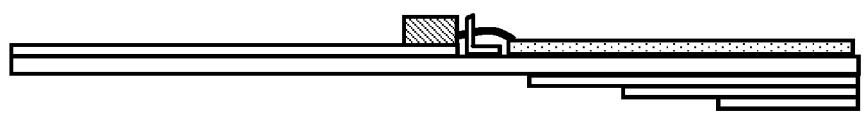

Similarly, as shown in the photovoltaic roofing element 3500 in FIG. 35, layers of shim material 3532, 3534, 3536 can be disposed in a stair-step fashion on the bottom surface 3528 of the base 3520 to allow it to more easily fit over a connector on an underlying course of photovoltaic elements, as described above. In the embodiment of FIG. 35, the layers of shim material are not flush with the up-roof edge of the base. Of course, in other embodiments, for example as shown in FIG. 36, the layers of shim material can be flush with the up-roof edge of the base.

In one embodiment the assembly is pre-assembled in a manufacturing environment. In another embodiment, the assembly is assembled in the field, the shingle support having a receptor zone as described in U.S. Provisional Patent Application Ser. No. 61/043,707 filed Apr. 9, 2008, in U.S. Provisional Patent Application Ser. No. 61/014,902 filed Dec. 19, 2007 and in U.S. Patent Application Publication no. 2009/0159118, the entirety of each of which is incorporated herein by reference.

Asphalt shingle constructions are known in the shingle art and can be used for the base material. Alternatively, other flexible base materials such as elastomeric membrane, polyvinylchloride membrane, thermoplastic polyolefin membrane or other flexible polymeric materials may be used. The shim materials can be the same as the flexible base materials, or may be different. When the shim materials are the same as the flexible base materials, the roofing substrates can be formed using multi-layer shingle production processes familiar to the person of skill in the art.

Another aspect of the invention is a photovoltaic system including a plurality of photovoltaic roofing elements as described above, electrically interconnected. The photovoltaic system (e.g., a photovoltaic roofing system) can be interconnected with one or more inverters to allow photovoltaically-generated electrical power to be used on-site, stored in a battery, or introduced to an electrical grid. For example, a single inverter can be used to collect the photovoltaically-generated power and prepare it for further use. In other embodiments, the photovoltaic roofing elements can be interconnected with a plurality of micro-inverters disposed on the roof. For example, a single micro-inverter can be used for each photovoltaic element or photovoltaic roofing element; or a single micro-inverter can be used for a group of photovoltaic elements or photovoltaic roofing elements.

In certain embodiments of the invention a plurality of photovoltaic roofing elements are disposed on a roof deck and electrically interconnected to form a photovoltaic roofing system. In certain embodiments a shield is provided together with the connector of the photovoltaic roofing element. In other embodiments, a shield is provided as part of the roofing substrate. In other embodiments, a shield is installed separately, for example, after the installation of the roofing substrate on the roof, or even after installation and interconnection of the photovoltaic elements.

There can be one or more layers of material (e.g. underlayment), between the roof deck and the photovoltaic laminates/roofing elements. The roof can also include one or more standard roofing elements, for example to provide weather protection at the edges of the roof, or in areas not suitable for photovoltaic power generation. In some embodiments, non-photovoltaically-active roofing elements are complementary in appearance or visual aesthetic to the photovoltaic roofing elements.

Any cabling interconnecting the photovoltaic roofing elements of the invention in a photovoltaic roofing system can, for example, be long and flexible enough to account for natural movement of a roof deck, for example due to heat, moisture and/or natural expansion/contraction.

It will be understood that power generated by the photovoltaic roofing systems described herein may be used to power the building itself or may be directed elsewhere on an electrical grid, as desired. Electrical systems for handling the photovoltaically-generated power are described, for example, in U.S. Patent Application Publication no. 2008/0271774, which is hereby incorporated herein by reference in its entirety. Photovoltaic elements suitable for use in the present invention are described in, for example, in U.S. Patent Application Publication no. 2009/0133340, which is hereby incorporated herein by reference in its entirety.

Another aspect of the invention is a method for installing a photovoltaic roofing system comprising disposing on a roof and electrically interconnecting a plurality of photovoltaic roofing elements as described herein. The disposal on the roof and electrical interconnections can be performed in any desirable order. In certain embodiments, the photovoltaic roofing elements themselves can be assembled on the roof, for example in conjunction with electrically interconnecting them, as described above with reference to U.S. Patent Application Publication no. 2009/0159118, the entirety of each of which is incorporated herein by reference.

Another aspect of the invention is a roof comprising a roof deck and a photovoltaic roofing system as described herein disposed on the roof deck. The photovoltaic roofing elements described herein can be utilized with many different building structures, including residential, commercial and industrial building structures.

Another aspect of the invention is a kit for the installation of a photovoltaic roofing system, the kit comprising a plurality of photovoltaic roofing elements as described herein.

Further, the foregoing description of embodiments of the present invention has been presented for the purposes of illustration and description. It is not intended to be exhaustive or to limit the invention to the precise forms disclosed. As the person of skill in the art will recognize, many modifications and variations are possible in light of the above teaching. It will be apparent to those skilled in the art that various modifications and variations can be made to the present invention without departing from the scope of the invention. Thus, it is intended that the present invention cover the modifications and variations of this invention provided they come within the scope of the claims and their equivalents.

What is claimed is:

1. A photovoltaic roofing element comprising
a roofing substrate;
a photovoltaic element disposed on the roofing substrate;
an electrical connector operatively connected to the photovoltaic element, the electrical connector having a top side, a down-roof side and an electrical terminus; and
a shield disposed adjacent the electrical terminus of the electrical connector on its top side or both its down-roof side and its top side, the shield having an top-facing surface disposed adjacent the top side of the electrical connector, the shield including a vertical or down-roof pointing flange extending from the top-facing surface of the shield.

2. A photovoltaic roofing element comprising
a roofing substrate;
a photovoltaic element disposed on the roofing substrate;
an electrical connector operatively connected to the photovoltaic element, the electrical connector having a top side, a down-roof side and an electrical terminus; and
a shield affixed to and extending vertically away from the roofing substrate, the shield being disposed adjacent the electrical terminus of the electrical connector at least on its down-roof side.

3. The photovoltaic roofing element according to claim 1, wherein the shield is in substantial contact with the roofing substrate.

4. The photovoltaic roofing element according to claim 3, wherein the shield is sealed to the roofing substrate with a sealant.

5. The photovoltaic roofing element according to claim 1, wherein the terminus of the electrical connector is on its up-roof side.

6. The photovoltaic roofing element according to claim 1, wherein the shield is integrally formed with or physically connected to the electrical connector.

7. The photovoltaic roofing element according to claim 1, wherein the roofing substrate is flexible.

8. The photovoltaic roofing element according to claim 1, wherein the roofing substrate has formed therein a recess shaped to at least partially receive the electrical connector and the shield.

9. The photovoltaic roofing element according to claim 8, wherein the recess is formed in a top surface of the roofing substrate.

10. The photovoltaic roofing element according to claim 8, wherein the recess is formed in a side of the roofing substrate.

11. The photovoltaic roofing element according to claim 8, wherein the recess is formed in a bottom surface of the roofing substrate.

12. The photovoltaic roofing element according to claim 1, wherein the roofing substrate comprises a base of roofing material having a top surface, the top surface having a headlap zone and an exposure zone, and one or more layers of shim material disposed on the top surface of the base in the headlap zone; wherein the electrical connector and the shield are disposed on the top surface of the base; and wherein the one or more layers of shim material have a total thickness at least about as great as the thickness of the combination of the electrical connector and the shield.

13. The photovoltaic roofing element according to claim 1, wherein the roofing substrate comprises a base of roofing material having a top surface and a bottom surface, the top surface having a headlap zone and an exposure zone; and one or more layers of shim material disposed on the bottom surface of the base; a photovoltaic element disposed on the top surface of the base; wherein the electrical connector and the shield are disposed on the top surface of the base; and wherein the one or more layers of shim material have a total thickness at least about as great as the thickness of the combination of the electrical connector and the shield.

14. A photovoltaic roofing system including an electrically-interconnected plurality of photovoltaic roofing elements according to claim 1.

15. The photovoltaic roofing system of claim 14, wherein the photovoltaic roofing system comprises:
a first photovoltaic roofing element, the first photovoltaic roofing element comprising
a flexible roofing substrate having a recess formed in its top surface or in its side surface,
a photovoltaic element disposed on the flexible roofing substrate, and
an electrical connector operatively coupled to the photovoltaic element and at least partially disposed in the recess; and
a second photovoltaic roofing element disposed so as to cover the electrical connector of the first photovoltaic roofing element, the second photovoltaic roofing element comprising:
a flexible roofing substrate,
a photovoltaic element disposed on the flexible roofing substrate, and
an electrical connector operatively coupled to the photovoltaic element.

16. The photovoltaic roofing system of claim 14, wherein the photovoltaic system comprises:
a first photovoltaic roofing element, the first photovoltaic roofing element comprising
a flexible roofing substrate,
a photovoltaic element disposed on the flexible roofing substrate, and
an electrical connector operatively coupled to the photovoltaic element; and
a second photovoltaic roofing element disposed adjacent the first photovoltaic roofing element, the second photovoltaic roofing element comprising:
a flexible roofing substrate having a recess formed therein, the electrical connector of the first photovoltaic roofing element being at least partially disposed in the recess,
a photovoltaic element disposed on the flexible roofing substrate, and
an electrical connector operatively coupled to the photovoltaic element.

17. A roof comprising a roof deck and a photovoltaic roofing system according to claim 14 disposed on the roof deck.

18. A method for installing a photovoltaic roofing system, the method comprising disposing on a roof deck and electrically interconnecting a plurality of photovoltaic roofing elements, each comprising
a roofing substrate;
a photovoltaic element disposed on the roofing substrate;
an electrical connector operatively connected to the photovoltaic element, the electrical connector having a top side, a down-roof side and an electrical terminus; and
a shield disposed adjacent the electrical terminus of the electrical connector on its top side or both its down-roof side and its top side, the shield having an top-facing surface disposed adjacent the top side of the electrical connector, the shield including a vertical or down-roof pointing flange extending from the top-facing surface of the shield.

19. A kit for the installation of a photovoltaic roofing system, the kit comprising a plurality of photovoltaic roofing elements according to claim 1.

20. The photovoltaic roofing element according to claim 1, wherein the flange points in a vertical direction.

21. The photovoltaic roofing element according to claim 1, wherein the flange points in the down-roof direction.

22. The photovoltaic roofing element according to claim 1, wherein the shield has a lateral dimension in the range of about 1 cm to about 5 cm.

23. The photovoltaic roofing element according to claim 1, wherein the flange extends from the top surface of the shield at or down-roof from the electrical terminus of the electrical connector.

24. The photovoltaic roofing element according to claim 1, wherein the shield overhangs the electrical terminus of the electrical connector, and flange extends from the top surface of the shield at or up-roof from the electrical terminus of the electrical connector.

* * * * *